(12) United States Patent
Matsuda et al.

(10) Patent No.: US 8,587,011 B2
(45) Date of Patent: Nov. 19, 2013

(54) LIGHT-EMITTING DEVICE, LIGHT-EMITTING MODULE, AND LAMP

(75) Inventors: Tsugihiro Matsuda, Kyoto (JP);
Nobuyoshi Takeuchi, Osaka (JP); Hideo Nagai, Osaka (JP); Takaari Uemoto, Osaka (JP); Masahiro Miki, Osaka (JP);
Atsushi Motoya, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/502,662

(22) PCT Filed: Sep. 6, 2011

(86) PCT No.: PCT/JP2011/004980
§ 371 (c)(1),
(2), (4) Date: Apr. 18, 2012

(87) PCT Pub. No.: WO2012/090356
PCT Pub. Date: Jul. 5, 2012

(65) Prior Publication Data
US 2013/0049031 A1 Feb. 28, 2013

(30) Foreign Application Priority Data
Dec. 28, 2010 (JP) ................................. 2010-293682

(51) Int. Cl.
*H01L 33/00* (2010.01)

(52) U.S. Cl.
USPC .............. 257/98; 257/E33.054; 257/E33.058; 438/26; 438/31; 438/69; 345/82

(58) Field of Classification Search
USPC ......... 257/79, 80, 81, 82, 91, 95, 98, 99, 676, 257/E33.054, E33.056, E33.058; 438/25, 438/26, 31, 69, 956; 345/30, 55, 82
See application file for complete search history.

(56) References Cited

U.S. PATENT DOCUMENTS 7,758,223 B2 7/2010 Osawa et al.
2004/0070333 A1* 4/2004 Lin et al. ...................... 313/500
(Continued)

FOREIGN PATENT DOCUMENTS

EP 1962350 8/2008
JP 5-63066 8/1993
(Continued)

OTHER PUBLICATIONS

Japan Office action, mail date is Jan. 17, 2012.
(Continued)

*Primary Examiner* — William D Coleman
*Assistant Examiner* — Su Kim
(74) *Attorney, Agent, or Firm* — Greenblum & Bernstein, P.L.C.

(57) ABSTRACT

A light-emitting device which emits light omnidirectionally is provided. A light-emitting device according to the present invention includes: a package which is translucent; an LED provided in a recess in the package; and a sealing member for sealing the LED and packaging the recess; and the recess includes a bottom surface on which the LED is mounted and a side surface surrounding a bottom surface, and light emitted by the LED is transmitted inside the package through the bottom surface and the side surface of the recess and is emitted to outside of the package from the back surface and the side surface of the package.

11 Claims, 19 Drawing Sheets

(56) References Cited

U.S. PATENT DOCUMENTS

| | | |
|---|---|---|
| 2005/0088077 A1* | 4/2005 | Naum et al. ............ 313/503 |
| 2005/0219835 A1* | 10/2005 | Nagayama ............ 362/84 |
| 2006/0163605 A1 | 7/2006 | Miyahara |
| 2006/0183625 A1 | 8/2006 | Miyahara |
| 2006/0227558 A1 | 10/2006 | Osawa et al. |
| 2007/0139949 A1 | 6/2007 | Tanda et al. |
| 2010/0012964 A1 | 1/2010 | Copic et al. |
| 2010/0237761 A1 | 9/2010 | Osawa et al. |
| 2010/0237779 A1 | 9/2010 | Osawa et al. |
| 2010/0244650 A1 | 9/2010 | Osawa et al. |
| 2010/0244694 A1 | 9/2010 | Osawa et al. |
| 2010/0253200 A1 | 10/2010 | Osawa et al. |
| 2011/0012147 A1* | 1/2011 | Bierhuizen et al. ........ 257/98 |
| 2011/0069495 A1 | 3/2011 | Hayasi et al. |
| 2011/0156569 A1 | 6/2011 | Osawa et al. |
| 2011/0210369 A1 | 9/2011 | Daicho et al. |
| 2011/0309386 A1 | 12/2011 | Osawa et al. |
| 2011/0310606 A1 | 12/2011 | Osawa et al. |
| 2012/0098451 A1 | 4/2012 | Okawa et al. |

FOREIGN PATENT DOCUMENTS

| | | |
|---|---|---|
| JP | 6-224474 | 8/1994 |
| JP | 7-326798 | 12/1995 |
| JP | 2002-289925 | 10/2002 |
| JP | 2002-353507 | 12/2002 |
| JP | 2002-360514 | 12/2002 |
| JP | 2003-243717 | 8/2003 |
| JP | 2004-158557 | 6/2004 |
| JP | 2006-313717 | 11/2006 |
| JP | 2008-91855 | 4/2008 |
| JP | 2008-235566 | 10/2008 |
| JP | 2009-043447 | 2/2009 |
| WO | 2005/004246 | 1/2005 |
| WO | 2008/056300 | 5/2008 |
| WO | 2010/044240 | 4/2010 |

OTHER PUBLICATIONS

European Search Report, mail date is Jan. 22, 2013.

* cited by examiner

LIGHT-EMITTING DEVICE, LIGHT-EMITTING MODULE, AND LAMP

TECHNICAL FIELD

The present invention relates to light-emitting devices, light-emitting modules, and lamps, and particularly relates to a light-emitting device and others using a semiconductor light-emitting element such as a light-emitting diode (LED).

BACKGROUND ART

In recent years, semiconductor light-emitting elements such as LED are used for lamps as highly efficient space-saving light sources. In particular, active research and development have been taking place on LED lamps using LEDs as the lighting replacing conventional fluorescent light and incandescent light bulb. For example, an LED lamp having the shape of light bulb (light bulb shaped LED lamp) has been proposed as lighting replacing the light bulb shaped fluorescent light and incandescent light bulb, and as lighting replacing the straight-tube fluorescent light, a straight-tube shaped LED lamp (straight-tube LED lamp) has been developed.

Examples of this type of LED lamps include a conventional light bulb shaped LED lamp disclosed in the patent literature 1, and conventional straight-tube LED lamp disclosed in the patent literature 2. LED modules each including a board on which LEDs are mounted are used for these LED lamps.

CITATION LIST

Patent Literature

[Patent Literature 1] Japanese Unexamined Patent Application Publication No. 2006-313717
[Patent Literature 2] Japanese Unexamined Patent Application Publication No. 2009-043447

SUMMARY OF INVENTION

Technical Problem

In the conventional light bulb shaped LED lamp, a heat sink is used for radiating heat generated at the LED, and the LED module is fixed to the heat sink. For example, in the light bulb shaped LED lamp disclosed in the patent literature 1, a metal case which serves as the heat sink is provided between the semispherical globe and the base, and the LED module is fixed to the upper surface of the metal case.

A heat sink is also used in the straight-tube LED lamp in order to radiate heat generated at the LED. In this case, a long metal base board made of aluminum, for example, is used as the heat sink. The metal base board is bonded to the inner surface of the straight tube with adhesive, and the LED module is fixed to the upper surface of the metal base board.

However, with the conventional light bulb shaped LED lamp and the straight-tube LED lamp, among the light emitted by the LED module, the light emitted toward the heat sink is blocked by the metal heat sink. Consequently, the light emitted by the conventional LED lamp spreads differently from the light emitted by the conventional incandescent light bulb, the light bulb shaped fluorescent light, or the straight-tube fluorescent light, which spreads omnidirectionally. In other words, with the conventional light bulb shaped LED lamp, it is difficult to achieve the omnidirectional light distribution property equivalent to that of the incandescent lamp and the existing light bulb shaped fluorescent lamp. In the same manner, in the conventional straight-tube LED lamp, it is difficult to achieve the omnidirectional light distribution property equivalent to that of the existing straight-tube fluorescent light.

One way to address this problem is that the light bulb shaped LED lamp has the configuration equivalent to that of the incandescent light bulb, for example. More specifically, such a configuration of the light bulb shaped LED lamp has an LED module replacing the filament coil of the incandescent light bulb without using the heat sink. With this configuration, the light from the LED module is not blocked by the heat sink.

However, the LED module used for the conventional LED lamp has a configuration in which light is extracted only from a side of a surface of the board on which the LED is mounted. More specifically, in the conventional light bulb shaped LED lamp and the conventional straight-tube LED lamp, among the light emitted by the LED module, the light traveling toward the heat sink is blocked by the heat sink as described above. Thus, the LED module is configured such that the light emitted by the LED module does not travel toward the heat sink but to a side opposite to the heat sink. As described above, the conventional LED module is configured to emit light only from one side of the board.

Accordingly, there is a problem that the omnidirectional light distribution property is not achieved even when the LED module used for the conventional light bulb shaped LED lamp and the straight-tube LED lamp is provided in a globe (bulb) of the incandescent light bulb.

The present invention has been conceived in order to solve the problem, and it is an object of the present invention to provide a light-emitting device, a light-emitting module, and a lamp achieving the omnidirectional light distribution property.

Solution to Problem

In order to solve the problem described above, an aspect of the light-emitting device according to the present invention includes a package which is translucent; a semiconductor light-emitting element provided in a recess in the package; and a sealing member for sealing the semiconductor light-emitting element and packaging the recess, in which the recess includes a bottom surface on which the semiconductor light-emitting element is mounted and a side surface surrounding the bottom surface.

According to this aspect, the package housing the semiconductor light-emitting device is translucent. Thus, the light emitted by the semiconductor light-emitting element is not only emitted from the upper surface of the package (on the side in which the recess is formed) toward outside, but also from the back surface and the side surfaces of the package, transmitted the inside of the package from the bottom surface and the side surface of the recess. Accordingly, the light by the semiconductor light-emitting element is emitted omnidirectionally.

Furthermore, in an aspect of the light-emitting device according to the present invention, it is preferable that the side surface is substantially perpendicular to the bottom surface.

According to this aspect, it is possible to suppress the reflection of the light emitted from the semiconductor light-emitting element toward the side surface of the recess on the side surface of the recess. With this, the light emitted toward the side surface of the recess can easily enter the inside of the package from the side surface of the recess.

Furthermore, in an aspect of the light-emitting device according to the present invention, it is preferable that the sealing member includes a first wavelength conversion material for converting a wavelength of light emitted by the semiconductor light-emitting element to a predetermined wavelength.

According to this aspect, the sealing member can convert the wavelength of the light emitted by the semiconductor light-emitting element to the predetermined wavelength. Accordingly, the light of desired color can be emitted.

Furthermore, in an aspect of the light-emitting device according to the present invention, it is preferable to include a wavelength conversion member formed on a back surface of the package and for converting the wavelength of the light emitted by the semiconductor light-emitting element to the predetermined wavelength.

According to this aspect, the light emitted from the back surface of the package can be converted into the predetermined wavelength by the wavelength conversion member, among the light emitted by the semiconductor light-emitting element. With this, the light of the desired color can be emitted from both the upper surface and the back surface of the package.

Furthermore, in an aspect of the light-emitting device according to the present invention, it is preferable that the wavelength conversion member is a sintered material film formed on the back surface, and the sintered material film is composed of a second wavelength conversion material for converting, to the predetermined wavelength, the wavelength of the light emitted by the semiconductor light-emitting element and transmitted the package and a binder for sintering made of an inorganic material.

According to this aspect, the light emitted from the back surface of the package may be converted to the predetermined wavelength by the sintered material film.

Furthermore, in an aspect of the light-emitting device according to the present invention, it is preferable to include a groove formed in the back surface of the package, for holding a third wavelength conversion material for converting the wavelength of the light emitted by the semiconductor light-emitting element to the predetermined wavelength.

According to this aspect, among the light emitted by the semiconductor light-emitting element, the wavelength of the light emitted from the side surface of the package can be converted to the predetermined wavelength by the third wavelength conversion material held in the groove. With this, the light of the desired color can be emitted from the upper surface, the back surface, and the side surface of the package.

Furthermore, in an aspect of the light-emitting device according to the present invention, it is preferable that the groove is formed surrounding the wavelength conversion member.

According to this aspect, the groove is exposed, making it easier for the groove to hold the third wavelength conversion material.

In an aspect of the light-emitting device according to the present invention, it is preferable to include a groove formed on the back surface of the package, and for holding a third wavelength conversion material for converting the wavelength of the light emitted by the semiconductor light-emitting element to the predetermined wavelength.

According to this aspect, among the light emitted by the semiconductor light-emitting element, the wavelength of the light emitted from the side surface of the package can be converted to the predetermined wavelength by the third wavelength conversion material held in the groove. With this, the light of the desired color can be emitted from the upper surface and the side surface of the package.

Furthermore, in an aspect of the light-emitting device according to the present invention, it is preferable that a total transmittance of the package is equal to or higher than 50%.

According to this aspect, the light emitted by the semiconductor light-emitting element can effectively emit the inside of the package.

Furthermore, in an aspect of the light-emitting device according to the present invention, it is preferable that the package is made of ceramic.

According to this aspect, the package can be formed by sintering.

Alternatively, in an aspect of the light-emitting device according to the present invention, it is preferable that the package is made of resin.

According to this aspect, the package may be formed by molding resin.

Furthermore, in an aspect of the light-emitting device according to the present invention, it is preferable that a plurality of semiconductor light-emitting elements are provided in the recess.

According to this aspect, a high-luminance light-emitting device can be implemented. Thus, it is possible to use the light-emitting device itself as the light-emitting module of devices.

In an aspect of the light-emitting module according to the present invention, the light-emitting module includes a plurality of the light-emitting devices as noted above that are stacked.

According to this aspect, using the light-emitting devices stacked allows extracting high-output light from a small area and implementing the light-emitting module having the omnidirectional light distribution property.

In an aspect of the light-emitting module according to the present invention, the light-emitting module includes: the light-emitting device; and a translucent board on which the light-emitting device is mounted.

According to this aspect, the translucent board transmits the light emitted from the light-emitting device. Thus, among the light emitted omnidirectionally from the light-emitting device, the light emitted toward the surface of the translucent board on which the light-emitting device is mounted is transmitted the translucent board. With this, the light-emitting module having the omnidirectional light distribution property can be implemented.

Furthermore, an aspect of the lamp according to the present invention includes the light-emitting module.

As described above, the present invention can also be implemented as a lamp including the light-emitting module.

Advantageous Effects of Invention

According to the present invention, the predetermined light can be emitted not only from the side of the package on which the semiconductor light-emitting element is provided, but also omnidirectionally from the package. Therefore, the light-emitting device, the light-emitting module, and the lamp having the omnidirectional light distribution property can be implemented.

DESCRIPTION OF EMBODIMENTS

The following shall describe the light-emitting device, the light-emitting module, and the lamp according to the embodiments of the present invention with reference to the figures. Note that, the figures are schematic diagrams, and illustration is not necessarily strictly accurate.

(Embodiment 1)

Figure 1A:
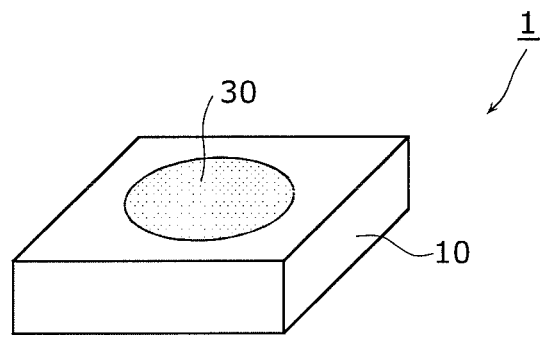
FIG. 1A is an external perspective view of the light-emitting device according to the embodiment 1 of the present invention.

First, a light-emitting device 1 according to the embodiment 1 of the present invention shall be described with reference to FIGS. 1A to 1C. FIG. 1A is an external perspective view of the light-emitting device 1 according to the embodiment 1 of the present invention, FIG. 1B is a plan view of the light-emitting device 1, and FIG. 1C is a cross-sectional view along the X-X' cross section in FIG. 1B.

Figure 1B:
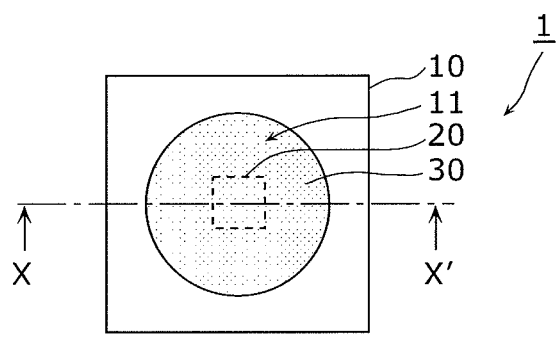
FIG. 1B is a plan view of the light-emitting device according to the embodiment 1 of the present invention.
Figure 1C:
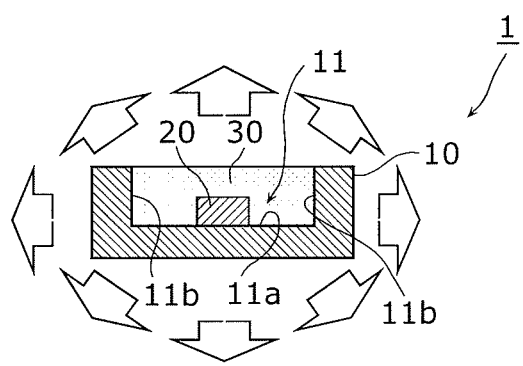
FIG. 1C is a cross-sectional view of the light-emitting device according to the embodiment 1 of the present invention along X-X' cross-section in FIG. 1B.

As illustrated in FIGS. 1A to 1C, the light-emitting device 1 according to the embodiment 1 of the present invention includes a translucent package 10, an LED 20 housed in the package 10, and a sealing member 30 for sealing the LED.

The package 10 includes a recess 11 having a circular bottom surface 11a, and a side surface 11b which is a cylindrical surface surrounding the bottom surface 11a. One LED 20 is mounted at a central part on the bottom surface 11a of the recess 11. The sealing member 30 is packaged in the recess 11.

The package 10 is translucent, and the light emitted from the LED 20 is transmitted inside of the package and is emitted to outside of the package. It is preferable that the total transmittance of the package 10 for the visible light is preferably equal to or higher than 50%. In order to increase the light-extraction efficiency further, it is preferable to configure the package 10 with the total transmittance equal to or higher than 80%, or more preferably equal to or higher than 90% such that the other side can be seen through.

Note that, the transmittance of the package 10 may be adjusted by the material composing the package 10 or by changing the thickness of the package 10 while using the same material. For example, it is possible to increase the total transmittance of the package 10 by reducing the thickness of the package 10.

The translucent package 10 with the configuration described above may be made of inorganic material or resin material. For example, as the translucent package made of inorganic material, a translucent ceramic material composed of alumina or aluminum nitride, a translucent glass material, quartz, sapphire, or others may be used.

In addition, it is preferable that the package 10 is a member having high thermal conductivity and high thermal emissivity for increasing heat dissipation. In this case, the package 10 is preferably made of glass or ceramic. Here, the emissivity is represented by a ratio with respect to heat emission on black body (full radiator), and has a value between 0 and 1. The emissivity of glass or ceramic is 0.75 to 0.95, and heat dissipation close to the black body radiation is achieved. In terms of practical use, the emissivity of the package 10 is preferably 0.8 or higher, and is more preferably 0.9 or higher.

In the embodiment 1, an alumina package having the total transmittance of 96% is used as the package 10. As described above, by using the ceramic material such as alumina, the package 10 can have high thermal conductivity. Thus, it is possible to effectively dissipate the heat generated at the LED 20 to outside of the package. In addition, as the size of the package 10, the vertical length and the horizontal length are 3 mm, and the height is 1 to 2 mm. The recess 11 is provided approximately 0.2 mm inside of the outer edge of the upper surface of the package 10, and has the depth approximately 0.2 mm subtracted from the height of the package 10.

Note that, in the embodiment 1, the package 10 is an integrally molded package using one material. However, it is not limited to this example. For example, the package 10 may include two members bonded into one piece, that is, a tabular translucent board composing the bottom surface of the recess and the back surface of the package, and a translucent tube provided on the translucent board and composing, with its inner surface, the side surface of the recess. In this case, the translucent board and the translucent tube may be composed of the same material, or different materials.

The LED 20 is an example of a semiconductor light-emitting element, and is provided inside of the recess 11 in the package 10. The LED 20 is an LED chip (bare chip) which emits visible light in a single color, and is mounted on the bottom surface 11a of the recess 11 in the package 10 by die-bonding using a die-attaching (die-bonding) material.

The LED 20 according to the embodiment 1 is configured to emit light omnidirectionally with the LED 20 as the center. More specifically, the LED 20 is an LED chip which emits light omnidirectionally, that is, upward, laterally, and downward of the LED 20, and is configured to emit 60% of the total amount of light upward, 20% of the total amount of light laterally, and 20% of the total amount of light downward. With this, the light emitted from the LED 20 travels toward the opening of the recess 11, toward the side surface 11b of the recess 11, and toward the bottom surface 11a of the recess 11.

Note that, in the embodiment 1, a blue LED chip which emits blue light when energized is used for the LED 20. As the blue LED chip, a gallium nitride series semiconductor light-emitting element made of an InGaN series material having the center wavelength from 440 nm to 470 nm may be used.

The sealing member 30 is a member for sealing the LED 20 and protecting the LED 20, and packages the recess 11 covering the LED 20. In the embodiment 1, as illustrated in FIG. 1C, the sealing member 30 is filled in the recess 11, packaging up to the opening plane of the recess 11.

The sealing member 30 includes a first wavelength conversion material for converting the wavelength of light emitted by the LED 20 to a predetermined wavelength. In the embodiment 1, the sealing member 30 is a phosphor-containing resin including predetermined phosphor particles as the first wavelength conversion material in a predetermined resin. More specifically, when the LED 20 is a blue LED, a phosphor containing resin in which yellow phosphor particles of yttrium, aluminum, and garnet (YAG) series dispersed in silicone resin may be used as the sealing material 30 for obtaining white light, for example. With this, the yellow phosphor particles in the sealing member 30 are excited by the blue light from the blue LED chip, thereby emitting yellow light. Accordingly, white light by the excited yellow light and the blue light from the blue LED chip is emitted from the sealing member 30.

The sealing member 30 with the configuration described above may be formed as follows. First, an uncured paste including the wavelength conversion material (phosphor particles), which is the material for the sealing component 30 is applied inside the recess 11 by a dispenser, covering the LED 20. Next, the applied paste of sealing material 30 is cured. With this, the sealing member 30 is formed.

Note that, although not illustrated, a power supply lines electrically connected to the electrodes of the LED 20 is formed on the inner surface of the package 10 (for example, at the bottom surface 11a of the recess 11). In addition, electrode terminals for receiving DC power from outside are formed on the external surface of the package 10 (for example, the back surface or the side surface of the recess 11), and the electrode terminal and the power supply line are electrically connected. With this configuration, DC power is supplied from the electrode terminals, causing the LED 20 to emit light. Accordingly, the LED 20 emits desired light.

As described above, with the light-emitting device 1 according to the embodiment 1 of the present invention, part of the blue light emitted from the LED 20 traveling toward the opening plane of the recess 11 and toward side surface 11b is converted into yellow light by the wavelength conversion of the yellow phosphor particles included in the sealing member 30. The white light is generated by the yellow light obtained by the wavelength conversion of the yellow phosphor particles and the blue light from the LED 20 which is not absorbed by the yellow phosphor particles.

As described above, the white light generated by the light emitted from the LED 20 is emitted from the upper side of the recess 11. Furthermore, since the package 10 is translucent in the embodiment 1, the white light also is transmitted inside the package 10 from the bottom surface 11a and the side surface 11b of the recess 11, and is also emitted from the back surface and the side surface of the package 10. Accordingly, it is possible to emit white light omnidirectionally from the light-emitting device 1, implementing the light-emitting device having the omnidirectional light-distribution property.

Furthermore, in the embodiment 1, it is preferable that the side surface 11b in the recess 11 in the cross-sectional view in FIG. 1C is substantially perpendicular to the bottom surface 11a. With this, the incident angle of the light emitted by the LED 20 on the side surface 11b can be as small as possible. Accordingly, it is possible to suppress the reflection of light emitted by the LED 20 toward the side surface 11b of the recess 11 on the side surface 11b of the recess 11. Accordingly, the light emitted by the LED 20 toward the side surface 11b of the recess 11 can easily enter the inside of the package 10 from the side surface 11b of the recess 11. With this, it is possible to increase the luminous flux emitted from the side surface of the package 10 to outside.

Figure 2A:
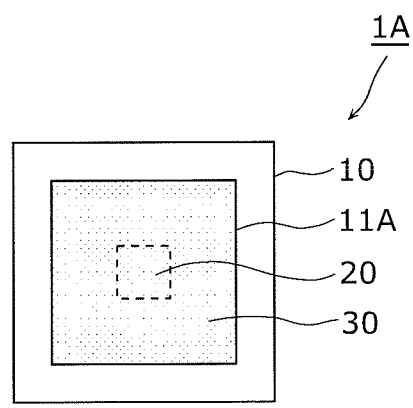
FIG. 2A is a plan view of the light-emitting device according to the variation of the embodiment 1 of the present invention.
Figure 2B:
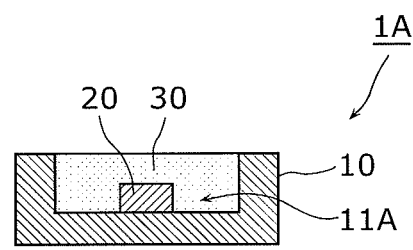
FIG. 2B is a cross-sectional view of the light-emitting device according to the variation of the embodiment 1 of the present invention.

Note that, in the light-emitting device 1 according to the embodiment 1, the shape of the bottom surface 11a of the recess 11 is circular. However, it is not limited to this example. FIG. 2A is a plan view of a light-emitting device 1A according to the variation of the embodiment 1 of the present invention, and FIG. 2B is a cross-sectional view of the light-emitting device 1A. As illustrated in FIGS. 2A and 2B, the shape of the bottom surface of the recess 11A may be a rectangle such as a square.

However, it is assumed that the light emitted by the LED 20 travels isotropically in plan view. Thus, it is preferable that the bottom surface 11a is circular as in the recess 11 in the light-emitting device 1 according to the embodiment 1 such that the white light effectively enters the side surface of the recess 11A.

(Embodiment 2)

Figure 3A:
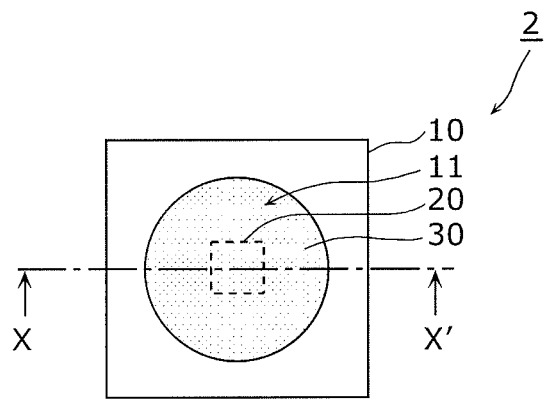
FIG. 3A is a plan view of the light-emitting device according to the embodiment 2 of the present invention.

Next, a light-emitting device 2 according to the embodiment 2 of the present invention shall be described with reference to FIGS. 3A to 3C. FIG. 3A is a plan view of the light-emitting device 2 according to the embodiment 2 of the present invention, FIG. 3B is a cross-sectional view of the light-emitting device 2 along X-X' cross section in FIG. 3A, and FIG. 3C is a back surface view of the light-emitting device 2.

The basic configuration of the light-emitting device 2 according to the embodiment 2 is identical to the configuration of the light-emitting device 1 according to the embodiment 1 of the present invention. Accordingly, the same reference numerals are assigned to the components in FIGS. 3A to 3C identical to the components in FIGS. 1A to 1C, and the detailed description for these components shall be omitted.

The light-emitting device 2 according to the embodiment 2 includes a wavelength conversion member formed on the back surface of the package 10, in addition to the configuration of the light-emitting device 1 according to the embodiment 1. The wavelength conversion part in the light-emitting device 2 is for converting the wavelength of the light emitted by the LED 20 into a predetermined wavelength, and light with a wavelength identical to the wavelength of light generated by the sealing member 30 is generated in the embodiment 2.

Figure 3B:
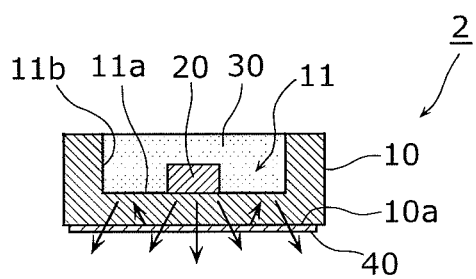
FIG. 3B is a cross-sectional view of the light-emitting device according to the embodiment 2 of the present invention along the X-X' cross section in FIG. 3A.
Figure 3C:
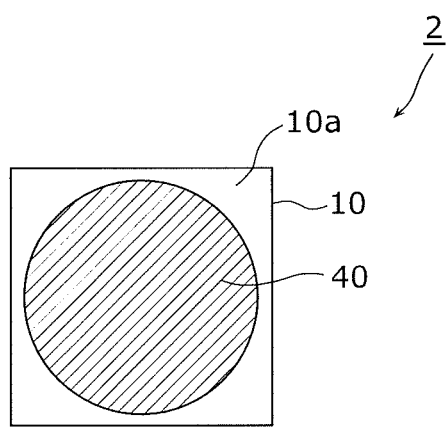
FIG. 3C is a back surface view of the light-emitting device according to the embodiment 2 of the present invention.

As illustrated in FIGS. 3B and 3C, the wavelength conversion member according to the embodiment 2 is composed of a sintered material film 40 formed on the back surface of the package 10. The sintered material film 40 includes a second wavelength conversion material for converting the wavelength of light emitted from the LED 20 transmitted the translucent package 10 into a predetermined wavelength, and a binder for sintering made of an inorganic material. Note that, when the wavelength conversion material is composed of the sintered material film 40, the package 10 is preferably made of a highly heat-resistant material such as ceramic or glass, since the sintered material film 40 is formed by sintering at a high temperature at approximately 600° C.

Among the light emitted by the LED 20, the second wavelength conversion material in the sintered material film 40 converts the wavelength of light entering the inside of the package 10 from the bottom surface 11a in the recess 11, transmitted the inside of the package 10, and emitted from the back surface of the package 10, and emits the light having the converted wavelength. Phosphor particles identical to the phosphor particles contained in the sealing member 30 may be used as the second wavelength conversion material. In the embodiment 2, the yellow phosphor particles are contained in the sealing member 30, and the yellow phosphor particles may also be used as the second wavelength conversion material contained in the sintered material film 40.

The binder for sintering in the sintered material film 40 includes a material which transmits the light emitted by the LED 20 and the wavelength converted light emitted by the second wavelength conversion material 12a. In the embodiment 2, glass frit (frit glass) made of silicon oxide ($SiO_2$) as the major component may be used as the binder for sintering. The glass frit is a binder (bonding material) for binding the second wavelength conversion material (phosphor particles) on the back surface of the package 10, and is preferably made of a material having a high transmittance to the visible light. The glass frit may be formed by heating glass powder so as to fuse the glass powder. As the glass powder for the glass frit, $SiO_2$—$B_2O_3$—$R_2O$ series, $B_2O_3$—$R_2O$ series or $P_2O_5$—$R_2O$ series (Note that all of the $R_2O$ is $Li_2O$, $Na_2O$, or $K_2O$) may be used. Alternatively, as the material for the binder for sintering, $SnO_2$—$B_2O_3$ made of low-melting point crystals may also be used other than the glass frit.

The sintered material film 40 with the configuration described above may be formed using a paste of the phosphor particles, the glass powder, solvent, and others obtained by mixing and kneading. The paste is printed or applied on the back surface of the package 10, and sintered so as to form the sintered material film 40.

Note that, in the light-emitting device 2 according to the embodiment 2, the emitted light is set to be white light, a blue LED is used as the LED 20, and YAG series yellow phosphor particles are used as the phosphor particles in the sealing member 30 and the sintered material film 40, in the same manner as the embodiment 1.

As described above, according to the light-emitting device 2 of the embodiment 2 of the present invention, part of the blue light emitted by the LED 20 traveling toward the opening plane and the side surface 11b in the recess 11 is converted to yellow light by the wavelength conversion of the yellow phosphor particles included in the sealing member 30 (the first wavelength conversion part) in the same manner as the embodiment 1.

Since the package 10 is translucent, part of the blue light emitted by the LED 20 is transmitted the bottom surface 11a of the recess 11, and is emitted from the back surface of the package 10. In the embodiment 2, the sintered material film 40 (the second wavelength conversion part) is formed on the back surface of the package 10. Thus, part of the light emitted by the LED 20 emitted from the back surface of the package 10 is converted to yellow light by the yellow phosphor particles included in the sintered material film 40.

As described above, in the embodiment 2, the wavelength of the blue light emitted by the LED 20 is converted, not only by the sealing member 30, but also by the sintered material film 40. The white light is generated by the yellow light obtained by the wavelength conversion of the yellow phosphor particles and the blue light by the LED 20 which is not absorbed by the yellow phosphor particles.

The white light generated by the light by the LED 20 is emitted from the upper side of the recess 11, and from the back surface and the side surface of the package 10, in the same manner as the embodiment 1. Furthermore, since the wavelength of the blue light by the LED 20 emitted from the back surface of the package 10 can be converted to the yellow light, it is possible to omnidirectionally emit the white light from the light-emitting device 2, and to set the white light emitted from the upper surface and the side surface of the package 10 and the white light emitted from the back surface of the package 10 uniform.

In addition, in the light-emitting device 2 according to the embodiment 2, the wavelength conversion member is composed of the sintered material film 40 made of an inorganic material. Accordingly, not only the wavelength conversion member is not degraded by the heat from the LED 20, but also can effectively dissipate the heat from the LED 20. With this, a highly reliable light-emitting device having a high heat dissipation property can be implemented.

Figure 4A:
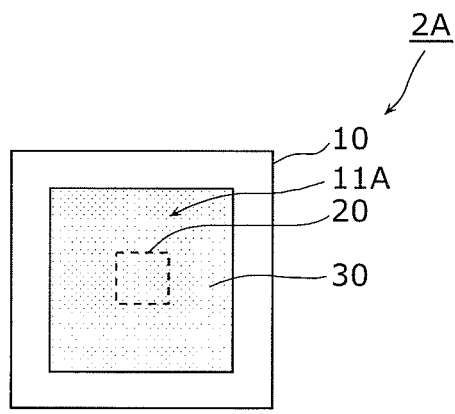
FIG. 4A is a plan view of the light-emitting device according to the variation of the embodiment 2 of the present invention.
Figure 4B:
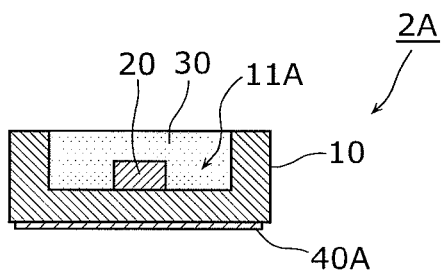
FIG. 4B is a cross-sectional view of the light-emitting device according to the variation of the embodiment 2 of the present invention.
Figure 4C:
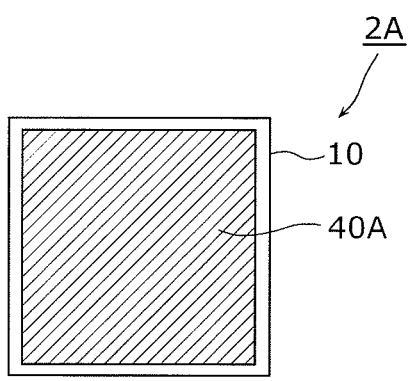
FIG. 4C is a back surface view of the light-emitting device according to the variation of the embodiment 2 of the present invention.

Note that, in the light-emitting device 2 according to the embodiment 2, the shape of the bottom surface 11a of the recess 11 and the sintered material film 40 is circular. However, it is not limited to this example. FIG. 4A is a plan view of a light-emitting device 2A according to the variation of the embodiment 2 of the present invention, FIG. 4B is a cross-sectional view of the light-emitting device 2A, and FIG. 4C is a back surface view of the light-emitting device 2. As illustrated in FIGS. 4A to 4C, the shape of the bottom surface of the recess 11A and the shape of the sintered material film 40A may be rectangle such as a square.

(Embodiment 3)

Figure 5A:
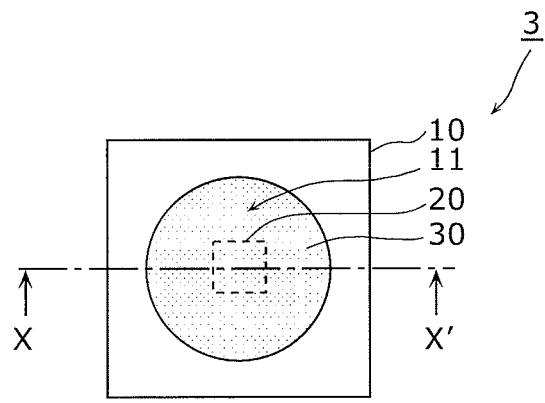
FIG. 5A is a plan view of the light-emitting device according to the embodiment 3 of the present invention.

Next, a light-emitting device 3 according to the embodiment 3 of the present invention shall be described with reference to FIGS. 5A to 5C. FIG. 5A is a plan view of the light-emitting device 3 according to the embodiment 3 of the present invention, FIG. 5B is a cross-sectional view of the light-emitting device 3 along X-X' cross section in FIG. 5A, and FIG. 5C is a back surface view of the light-emitting device 3.

The basic configuration of the light-emitting device 3 according to the embodiment 3 is identical to the configuration of the light-emitting device 1 according to the embodiment 1 of the present invention. Accordingly, the same reference numerals are assigned to the components in FIGS. 5A to 5C identical to the components in FIGS. 1A to 1C, and the detailed description for these components shall be omitted.

Figure 5B:
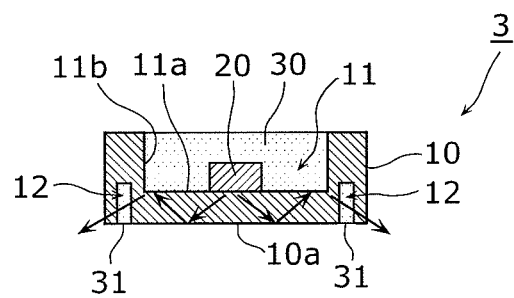
FIG. 5B is a cross-sectional view of the light-emitting device according to the embodiment 3 of the present invention along the X-X' cross section in FIG. 5A.
Figure 5C:
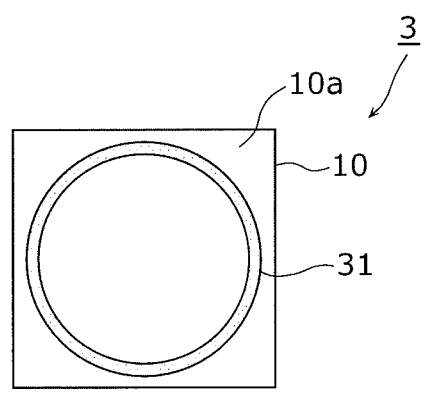
FIG. 5C is a back surface view of the light-emitting device according to the embodiment 3 of the present invention.

As illustrated in FIGS. 5A to 5C, the light-emitting device 3 according to the embodiment 3 includes a groove 12 formed in the back surface of the package 10 and a phosphor containing resin 31 packaged in the groove 12, in addition to the components of the light-emitting device 1 according to the embodiment 1.

As illustrated in FIG. 5B, the groove 12 is recessed from the back surface toward the upper surface of the package 10. In addition, the groove 12 is formed in a circular ring shape surrounding the recess 11 as illustrated in FIG. 5C. The groove 12 can be formed by cutting the back surface of the package 10 out by laser or other means. In the embodiment 3, the width of the groove 12 is 0.5 mm, and the depth of the groove 12 is approximately from 0.3 mm to half the height of the package 10.

Note that, the depth of the groove 12 is preferably longer than the distance from the back surface of the package 10 to the bottom surface 11a of the recess 11, as illustrated in FIG. 5B. With this, it is possible to suppress only the blue light by the LED 20 emitted from the side surface of the package 10.

Phosphor particles (a third wavelength conversion material) for converting the wavelength of the light emitted by the LED 20 into a predetermined wavelength may be used for the phosphor containing resin 31. In the embodiment 3, the phosphor containing resin used for the sealing member 30 is used for the phosphor containing resin 31.

Note that, in the light-emitting device 3 according to the embodiment 3, the emitted light is set to be white light, a blue LED is used as the LED 20, and YAG series yellow phosphor particles are used as the phosphor particles in the sealing member 30 and the phosphor containing resin 31, in the same manner as the embodiment 1.

As described above, according to the light-emitting device 3 of the embodiment 3 of the present invention, part of the blue light emitted by the LED 20 traveling toward the opening plane and the side surface 11b in the recess 11 is converted to yellow light by the wavelength conversion of the yellow phosphor particles included in the sealing member 30 (the first wavelength conversion part) in the same manner as the embodiment 1.

Since the package 10 is translucent, part of the blue light emitted by the LED 20 is transmitted the bottom surface 11a of the recess 11, and is emitted from the back surface of the package 10. In the embodiment 3, the groove 12 in which the phosphor containing resin 31 is packaged is formed in the back surface of the package 10. Thus, as illustrated in FIG. 5B, part of the light emitted by the LED 20 transmitted the bottom surface 11a of the recess 11 and traveling between the back surface of the package 10 and the bottom surface 11a in the recess 11 toward the side surface of the package 10 is converted to yellow light by the wavelength conversion of the yellow phosphor particles in the groove 12.

As described above, in the embodiment 3, the wavelength of the blue light emitted by the LED 20 is converted, not only by the sealing member 30, but also by the phosphor containing resin 31. The white light is generated by the yellow light obtained by the wavelength conversion of the yellow phosphor particles and the blue light from the LED 20 which is not absorbed by the yellow phosphor particles.

The white light generated using the light by the LED 20 is not only emitted from the upper side of the recess 11, but also from the back surface and the side surface of the package 10. Thus, the white light is omnidirectionally emitted from the light-emitting device 3.

Figure 6A:
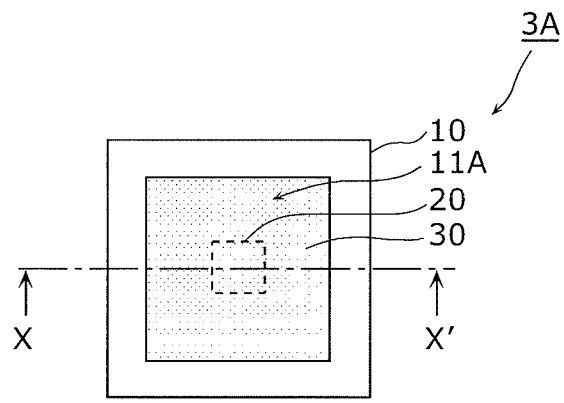
FIG. 6A is a plan view of the light-emitting device according to the variation of the embodiment 3 of the present invention.
Figure 6B:
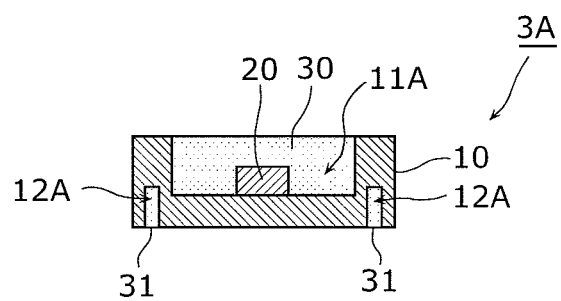
FIG. 6B is a cross-sectional view of the light-emitting device according to the variation of the embodiment 3 of the present invention.
Figure 6C:
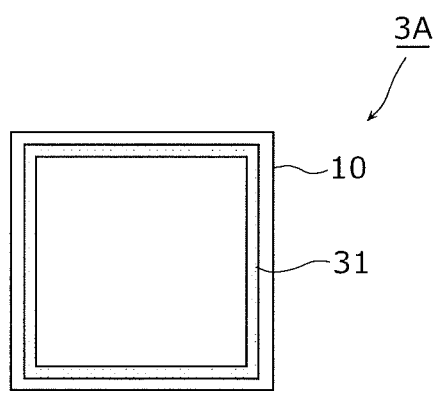
FIG. 6C is a back surface view of the light-emitting device according to the variation of the embodiment 3 of the present invention.

Note that, in the light-emitting device 3 according to the embodiment 3, the shape of the bottom surface 11a of the recess 11 circular, and the shape of the groove 12 is a circular ring. However, it is not limited to this example. FIG. 6A is a plan view of a light-emitting device 3A according to the variation of the embodiment 3 of the present invention, FIG. 6B is a cross-sectional view of the light-emitting device 3A, and FIG. 6C is a back surface view of the light-emitting device 3A. As illustrated in FIGS. 6A to 6C, the shape of the bottom surface of the recess 11A may be a rectangle such as a square, and the shape of the groove 12A may be a rectangular loop.

(Embodiment 4)

Figure 7A:
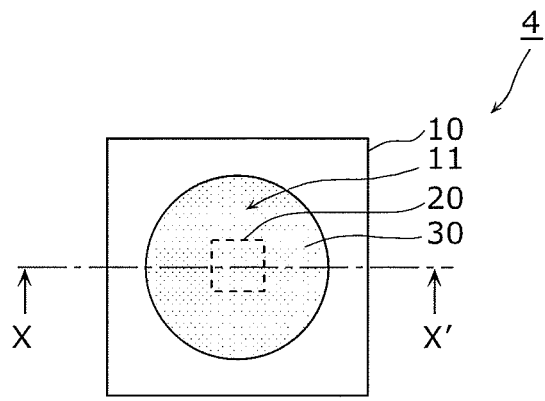
FIG. 7A is a plan view of the light-emitting device according to the embodiment 4 of the present invention.

Next, a light-emitting device 4 according to the embodiment 4 of the present invention shall be described with reference to FIGS. 7A to 7C. FIG. 7A is a plan view of the light-emitting device 4 according to the embodiment 4 of the present invention, FIG. 7B is a cross-sectional view of the light-emitting device 4 along X-X' cross section in FIG. 7A, and FIG. 7C is a back surface view of the light-emitting device 4.

The basic configuration of the light-emitting device 4 according to the embodiment 4 is identical to the light-emitting devices 2 and 3 according to the embodiments 2 and 3 of the present invention. Accordingly, the same reference numerals are assigned to the components in FIGS. 7A to 7C identical to the components in FIGS. 3A to 3C and FIGS. 5A to 5C, and the detailed description for these components shall be omitted.

Figure 7B:
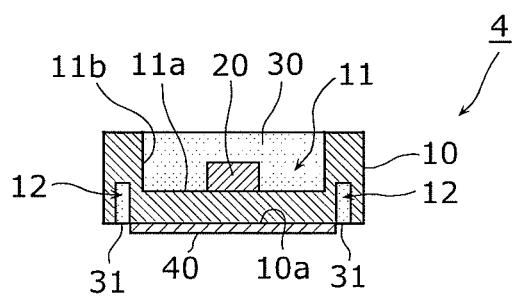
FIG. 7B is a cross-sectional view of the light-emitting device according to the embodiment 4 of the present invention along the X-X' cross section in FIG. 7A.
Figure 7C:
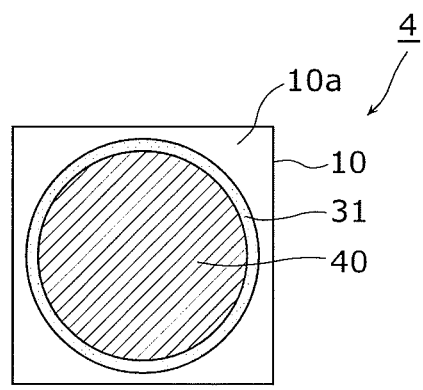
FIG. 7C is a back surface view of the light-emitting device according to the embodiment 4 of the present invention.

As illustrated in FIGS. 7A to 7C, the light-emitting device 4 according to the embodiment 2 is a combination of the light-emitting device 4 according to the embodiment 2 and the light-emitting device 3 according to the embodiment 3. More specifically, the sintered material film 40 is formed on the back surface of the package 10, and a groove 12 in which the phosphor containing resin is packaged is formed in the back surface of the package 10.

In addition, in the embodiment 4, the groove 12 is formed surrounding the sintered material film 40 (wavelength conversion member), as illustrated in FIGS. 7B and 7C.

Note that, in the same manner as the embodiment 1, the emitted light is set to be white light, a blue LED is used as the LED 20, and YAG series yellow phosphor particles are used as the phosphor particles in the sealing member 30, the sintered material film 40, and the phosphor containing resin 31, in the light-emitting device 4 according to the embodiment 4.

As described above, with the light-emitting device 4 according to the embodiment 4 of the present invention, part of the blue light emitted from the LED 20 traveling toward the opening plane and the side surface 11*b* of the recess 11 is converted into yellow light by the wavelength conversion of the yellow phosphor particles included in the sealing member 30 (first wavelength conversion part).

Since the package 10 is translucent, part of the blue light emitted by the LED 20 is transmitted the bottom surface 11*a* of the recess 11, and is emitted from the back surface and the side surface of the package 10. In the embodiment 4, the sintered material film 40 (the second wavelength conversion part) is formed on the back surface of the package 10, and the groove 12 (the third wavelength conversion part) in which the phosphor containing resin 31 is sealed is formed in the back surface of the package 10. With this, in the same manner as the embodiment 2, part of the light emitted by the LED 20 emitted from the back surface of the package 10 is converted to the yellow light by the wavelength conversion of the yellow phosphor particles included in the sintered material film 40. Another part of light emitted by the LED 20, transmitted the bottom surface 11*a* of the recess 11, and traveling, between the back surface of the package 10 and the bottom surface 11*a* of the recess 11, toward the side surface of the package 10 is converted to yellow light by the yellow phosphor particles in the groove 12.

As described above, in the embodiment 4, the wavelength of the blue light emitted by the LED 20 is converted, not only by the sealing member 30, but also by the sintered material film 40 and the phosphor containing resin 31. The white light is generated by the yellow light obtained by the wavelength conversion of the yellow phosphor particles and the blue light from the LED 20 which is not absorbed by the yellow phosphor particles.

The white light generated using the light by the LED 20 is emitted from the upper side of the recess 11, and is also emitted from the back surface and the side surface of the package 10. Furthermore, in the embodiment 4, the blue light by the LED 20 emitted from the back surface and the side surface of the package 10 can be converted into yellow light by the wavelength conversion. Thus, it is possible to emit yellow light omnidirectionally from the light-emitting device 4, and making the white light emitted from the upper surface of the package 10, the white light emitted from the back surface of the package 10, and the white light emitted from the side surface of the package 10 even more uniform.

Figure 8A:
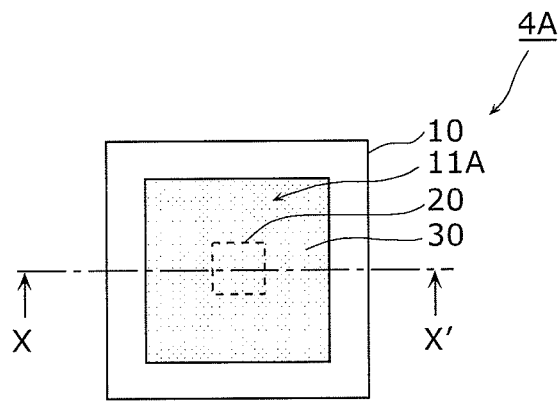
FIG. 8A is a plan view of the light-emitting device according to the variation of the embodiment 4 of the present invention.
Figure 8B:
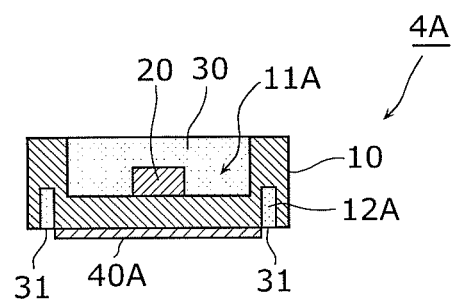
FIG. 8B is a cross-sectional view of the light-emitting device according to the variation of the embodiment 4 of the present invention along the X-X' cross section in FIG. 8A.
Figure 8C:
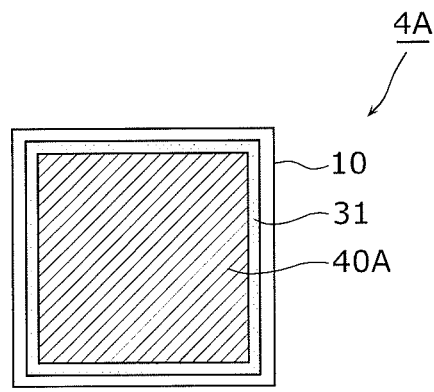
FIG. 8C is a back surface view of the light-emitting device according to the variation of the embodiment 4 of the present invention.

Note that, in the light-emitting device 4 according to the embodiment 4, the shape of the bottom surface 11*a* of the recess 11 and the sintered material film 40 is circular, and the shape of the groove 12 is a circular ring. However, it is not limited to this example. FIG. 8A is a plan view of a light-emitting device 4A according to the variation of the embodiment 4 of the present invention, FIG. 8B is a cross-sectional view of the light-emitting device 4A along X-X' cross section in FIG. 8A, and FIG. 8C is a back surface view of the light-emitting device 8A. As illustrated in FIGS. 8A to 8C, the shape of the bottom surface of the recess 11A and the shape of the sintered material film 40A may be rectangle such as a square, and the shape of the groove 12A may be a rectangular loop.

(Embodiment 5)

Figure 9A:
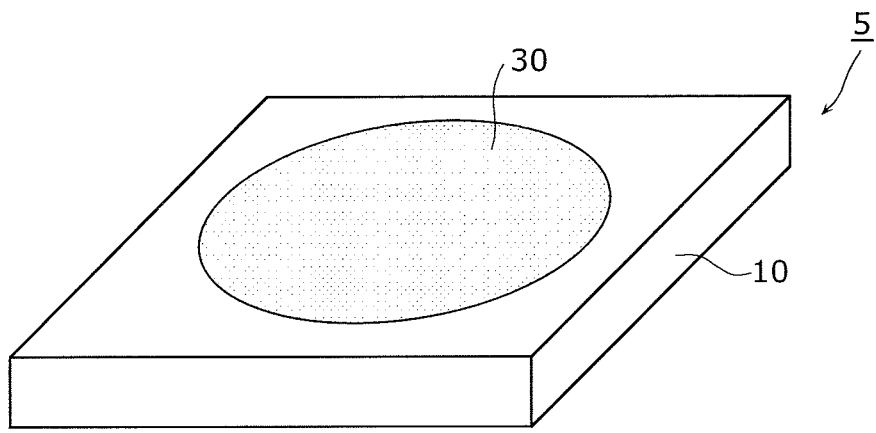
FIG. 9A is an external perspective view of the light-emitting device according to the embodiment 5 of the present invention.

Next, a light-emitting device 5 according to the embodiment 5 of the present invention shall be described with reference to FIGS. 9A to 9C. FIG. 9A is an external perspective view of the light-emitting device according to the embodiment 5 of the present invention, FIG. 9B is a plan view of the light-emitting device 5, and FIG. 9C is a cross-sectional view along the X-X' cross section in FIG. 9B.

The basic configuration of the light-emitting device 5 according to the embodiment 5 is identical to the configuration of the light-emitting device 1 according to the embodiment 1 of the present invention. Accordingly, the same reference numerals are assigned to the components in FIGS. 9A to 9C identical to the components in FIGS. 1A to 1C, and the detailed description for these components shall be omitted.

Figure 9B:
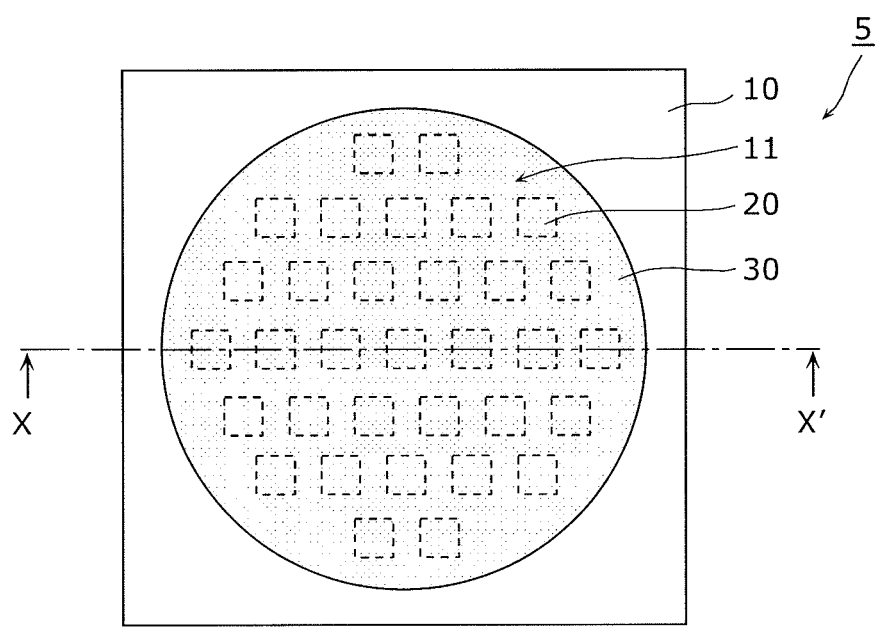
FIG. 9B is a plan view of the light-emitting device according to the embodiment 5 of the present invention.
Figure 9C:
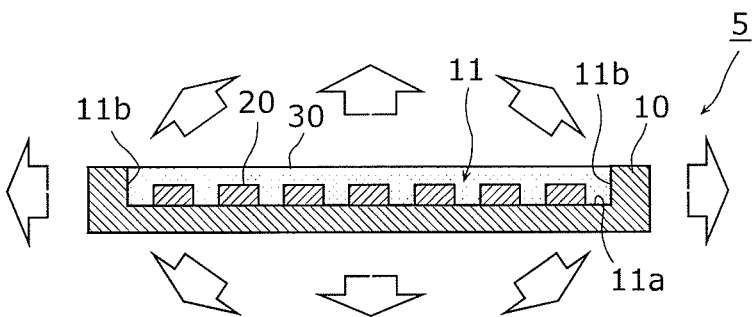
FIG. 9C is a cross-sectional view of the light-emitting device according to the embodiment 5 of the present invention along X-X' cross-section in FIG. 9B.

As illustrated in FIGS. 9A to 9C, the light-emitting device 5 according to the embodiment 5 has a configuration in which multiple LEDs 20 are arranged in the recess 11 of the light-emitting device 1 according to the embodiment 1. In the embodiment 5, the LEDs 20 are provided horizontally and vertically equidistant from one another. Note that, the shape of the LED 20 in the embodiment 20 is identical to the shape of the LED 20 in the embodiment 1. Thus, the package 10 in the embodiment 5 is larger than the package 10 in the embodiment 1 according to the number of the LEDs 20 provided.

Figure 10A:
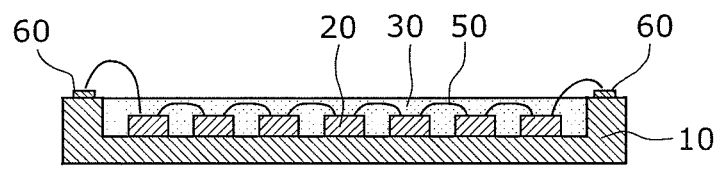
FIG. 10A is a diagram for illustrating a wiring method for supplying power to the LEDs in the light-emitting device according to the embodiment 5 of the present invention.
Figure 10B:
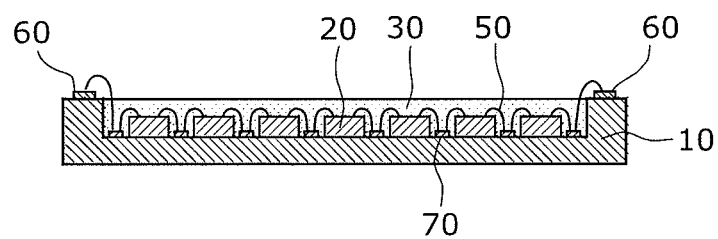
FIG. 10B is a diagram for describing another wiring method for supplying power to the LEDs in the light-emitting device according to the embodiment 5 of the present invention.

FIGS. 10A and 10B illustrate wiring methods for supplying power to the LEDs 20 in the light-emitting device 5 according to the embodiment 5.

As illustrated in FIG. 10A, p-side electrodes and n-side electrodes of the LEDs 20 may be electrically connected by the wires 50. This configuration allows the LEDs 20 connected in series. Note that, as illustrated in FIG. 10A, two of the LEDs 20 are electrically connected to electrode terminals 60 formed on the upper surface of the package 10. Accordingly, the power supply is provided to the LEDs 20 through the electrode terminals 60 receiving the power from outside.

Alternatively, as illustrated in FIG. 10B, power supply wires 70 may be patterned on the bottom surface of the recess 11, and LEDs 20 may be electrically connected and the two LEDs 20 and the electrode terminals 60 may be electrically connected via the power supply wires 70 and the wires 50.

Note that, in the light-emitting device 5 according to the embodiment 5, the emitted light is set to be white light, a blue LED is used as the LED 20, and YAG series yellow phosphor particles are used as the phosphor particles in the sealing member, in the same manner as the embodiment 1.

As described above, in the light-emitting device 5 according to the embodiment 5 of the present invention, part of the blue light emitted from the LED 20 traveling toward the opening plane and the side surface 11*b* of the recess 11 is converted into yellow light by the wavelength conversion of the yellow phosphor particles included in the sealing member 30. The white light is generated by the yellow light obtained by the wavelength conversion of the yellow phosphor particles and the blue light from the LED 20 which is not absorbed by the yellow phosphor particles.

As described above, the white light generated by the light emitted from the LED 20 is emitted from the upper side of the recess 11. Furthermore, since the package 10 is translucent in the embodiment 5, the white light also is transmitted inside the package 10 from the bottom surface 11a and the side surface 11b of the recess 11, and is also emitted from the back surface and the side surface of the package 10. Accordingly, it is possible to emit white light omnidirectionally from the light-emitting device 5, implementing the light-emitting device having the omnidirectional light-distribution property.

Furthermore, since multiple LEDs 20 are used for the light-emitting device 5 according to the embodiment 5, a light-emitting device with high luminance can be implemented. Accordingly, the light-emitting device 5 according to the embodiment 5 can be used, by itself, as a light-emitting module of apparatuses such as a lamp.

Figure 11A:
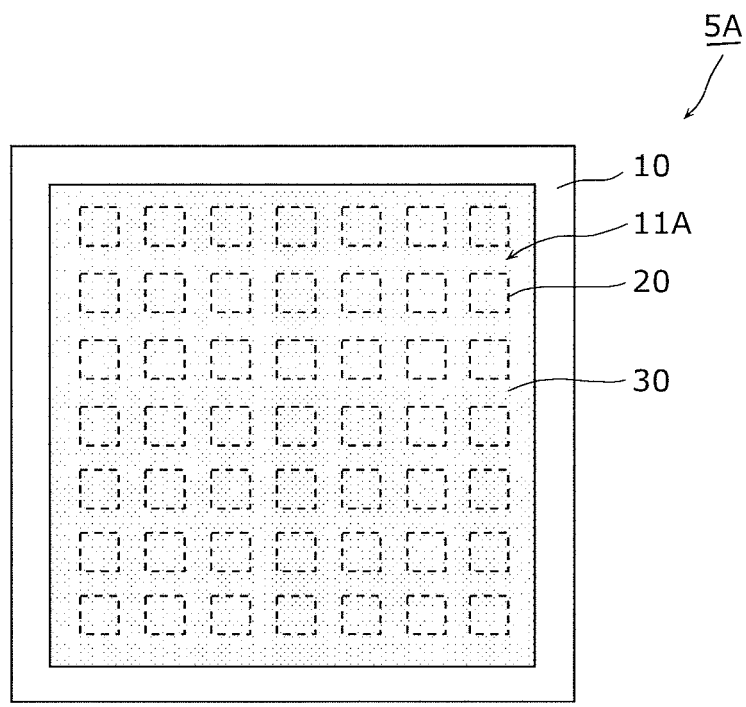
FIG. 11A is a plan view of the light-emitting device according to the variation of the embodiment 5 of the present invention.
Figure 11B:
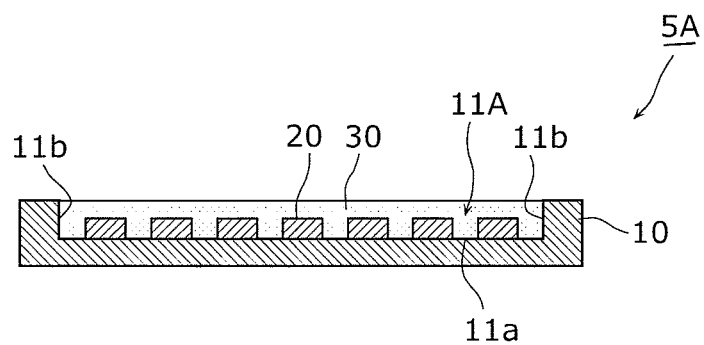
FIG. 11B is a cross-sectional view of the light-emitting device according to the variation of the embodiment 5 of the present invention.

Note that, in the light-emitting device 5 according to the embodiment 5, the shape of the bottom surface 11a of the recess 11 is circular. However, it is not limited to this example. FIG. 11A is a plan view of a light-emitting device 5A according to a variation of the embodiment 5 of the present invention, and FIG. 11B is a cross-sectional view of the light-emitting device 5A. As illustrated in FIGS. 11A and 11B, the shape of the bottom surface of the recess 11A may be a rectangle such as a square.

The light-emitting devices 2 to 4 according to the embodiments 2 to 4 may be applied to the light-emitting device 5 according to the embodiment 5.

(Embodiment 6)

Figure 12A:
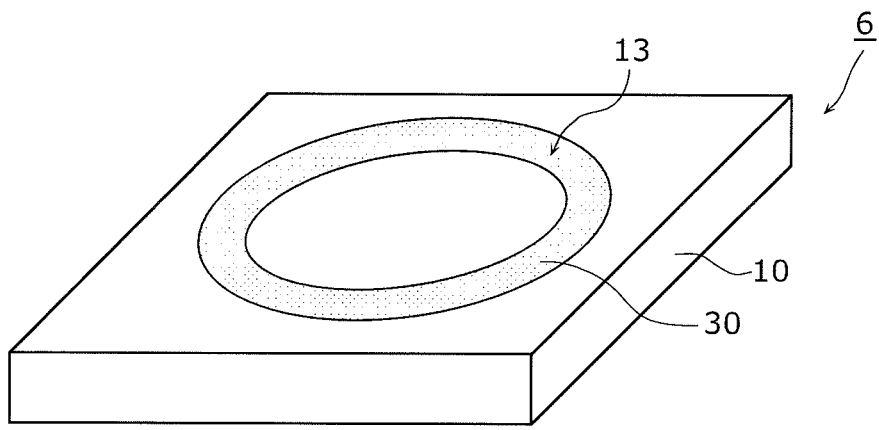
FIG. 12A is an external perspective view of the light-emitting device according to the embodiment 6 of the present invention.

Next, a light-emitting device 6 according to the embodiment 6 of the present invention shall be described with reference to FIGS. 12A to 12C. FIG. 12A is an external perspective view of the light-emitting device 6 according to the embodiment 6 of the present invention, FIG. 12B is a plan view of the light-emitting device 6, and FIG. 12C is a cross-sectional view along the X-X' cross section in FIG. 12B.

The basic configuration of the light-emitting device 6 according to the embodiment 6 is identical to the configuration of the light-emitting device 1 according to the embodiment 1 of the present invention. Accordingly, the same reference numerals are assigned to the components in FIGS. 12A to 12C identical to the components in FIGS. 1A to 1C, and the detailed description for these components shall be omitted.

Figure 12B:
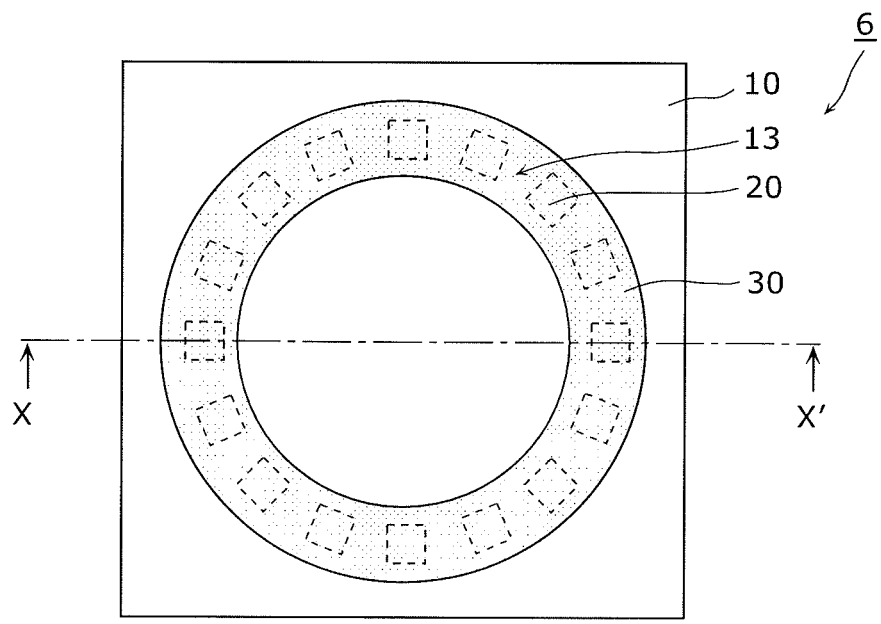
FIG. 12B is a plan view of the light-emitting device according to the embodiment 6 of the present invention.
Figure 12C:
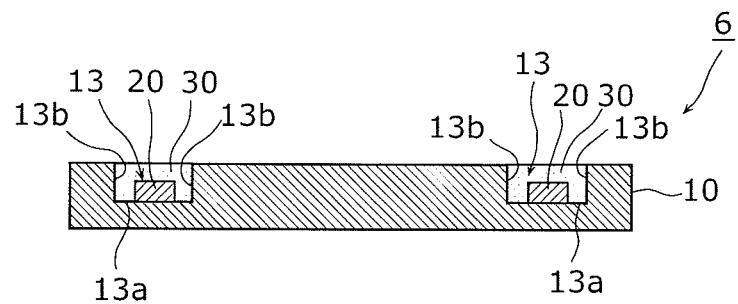
FIG. 12C is a cross-sectional view of the light-emitting device according to the embodiment 6 of the present invention along X-X' cross-section in FIG. 12B.

As illustrated in FIGS. 12A to 12C, in the light-emitting device 6 according to the embodiment 6, the recess 13 in which the LEDs 20 are arranged has a circular ring shape, and the LEDs 20 are arranged in the recess 13, compared to the light-emitting device 1 according to the embodiment 1.

In the embodiment 6, the recess 13 includes a bottom surface 13a which is a circular ring of a constant width, and side surfaces 13b configured to surround the bottom surface 13a and facing with each other. In the embodiment 6, a line of the LEDs 20 is equidistantly arranged in circle in the recess 13.

Note that, the shape of the LED 20 in the embodiment 6 is identical to the shape of the LED 20 in the embodiment 1. Thus, the package 10 in the embodiment 6 is larger than the package 10 in the embodiment 1 according to the number of the LEDs 20.

Note that, in the light-emitting device 5 according to the embodiment 5, the emitted light is set to be white light, a blue LED is used as the LED 20, and YAG series yellow phosphor particles are used as the phosphor particles in the sealing member, in the same manner as the embodiment 1.

As described above, with the light-emitting device 6 according to the embodiment 6 of the present invention, part of the blue light emitted from the LED 20 traveling toward the opening plane and the side surface 13b of the recess 13 is converted into yellow light by the wavelength conversion of the yellow phosphor particles included in the sealing member 30. The white light is generated by the yellow light obtained by the wavelength conversion of the yellow phosphor particles and the blue light from the LED 20 which is not absorbed by the yellow phosphor particles.

As described above, the white light generated by the light emitted from the LEDs 20 is emitted from the upper side of the recess 13. Furthermore, since the package 10 is translucent in the embodiment 6, the white light is also transmitted inside the package 10 from the bottom surface 13a and the side surfaces 13b of the recess 13, and is also emitted from the back surface and the side surfaces of the package 10. Furthermore, in the light-emitting device 6 according to the embodiment 6, the white light is transmitted inside of the package 10 from the side surfaces 13b inside the recess 13, and is emitted from the upper surface and the back surface of the package 10. Accordingly, it is possible to emit white light omnidirectionally from the light-emitting device 5, implementing the light-emitting device having the omnidirectional light-distribution property.

Furthermore, since multiple LEDs 20 are used for the light-emitting device 6 according to the embodiment 6, a light-emitting device with high luminance can be implemented. Accordingly, the light-emitting device 6 according to the embodiment 6 can be used, by itself, as a light-emitting module of apparatuses such as a lamp.

Note that, in the light-emitting device 6 according to the embodiment 6, the shape of the bottom surface 13a of the recess 13 is a circular ring. However, it is not limited to this example. For example, the shape of the bottom surface 13a of the recess 13 may be a rectangular ring.

The light-emitting devices 2 to 4 according to the embodiments 2 to 4 may be applied to the light-emitting device 6 according to the embodiment 6. In this case, the shape of the sintered material film 40 formed on the back surface of the package 10 may be circular, or may be ring-shaped coinciding the shape of the recess 13.

(Embodiment 7)

Figure 13:
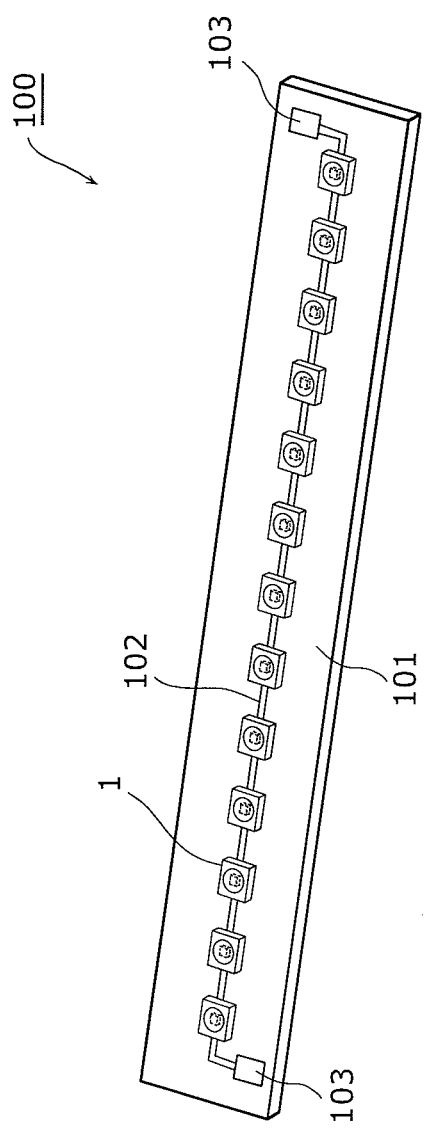
FIG. 13 is an external perspective view of the light-emitting module according to the embodiment 7 of the present invention.

Next, a light-emitting module 100 according to the embodiment 7 shall be described with reference to FIG. 13. FIG. 13 is an external perspective view of the light-emitting module 100 according to the embodiment 7 of the present invention.

As illustrated in FIG. 13, the light-emitting module 100 (LED module) according to the embodiment 7 is a surface mount device (SMD) LED module, and includes a translucent board 101 and light-emitting devices 1 each of which is an SMD-type LED device.

The board 101 is a long translucent board for mounting the light-emitting devices 1, and light emitted from the light-emitting device 1 is transmitted the board 101. The board 101 is a board for mounting the light-emitting devices 1, and multiple light-emitting devices 1 are mounted in line on the board 101, in the embodiment 7. A translucent ceramic substrate made of aluminum nitride, a transparent glass substrate, or a flexible printed circuit (FPC) which is made of flexible resin may be used as the board 101.

The light-emitting device 1 is a light-emitting device 1 according to the embodiment 1 illustrated in FIG. 1, and emits light omnidirectionally. Note that, although the light-emitting device 1 according to the embodiment 1 is used as the light-emitting device 1, it is not limited to this example. For example, the light-emitting devices according to the embodiments 2 to 6 and the variations of the embodiments may also be used. In this case, the same light-emitting devices may be mounted. Alternatively, difference light-emitting devices may be mounted.

Furthermore, the light-emitting module 100 according to the embodiment 7 includes lines 102 and electrode terminals 103.

The lines 102 are metal lines made of tungsten (W) or copper (Cu), and are patterned into predetermined shape for electrically connecting the light-emitting devices 1. The lines 102 are patterned for electrically connecting the light-emitting devices 1 at the ends and the electrode terminals 103.

The electrode terminals 103 are external connection terminals for receiving DC power from outside and supply the DC power to the light-emitting devices 1, and are electrically connected to the lines 102. With the supply of the DC voltage received by the electrode terminals 103 to the light-emitting devices 1, the LEDs in the light-emitting devices 1 emit light.

According to the light-emitting module 100 according to the embodiment 7 of the present invention, the light emitted from the light-emitting device 1 can be transmitted through the translucent board 101. Thus, out of the light emitted from the light-emitting device omnidirectionally, the light emitted toward the surface of the board 101 on which the light-emitting devices 1 are mounted can be transmitted through the board 101. Therefore, the light is emitted from the first surface of the board 101 on which the light-emitting device 1 is mounted and a surface opposite to the first surface, and thereby implementing the light-emitting module having omnidirectional light-distribution property.

(Embodiment 8)

Figure 14:
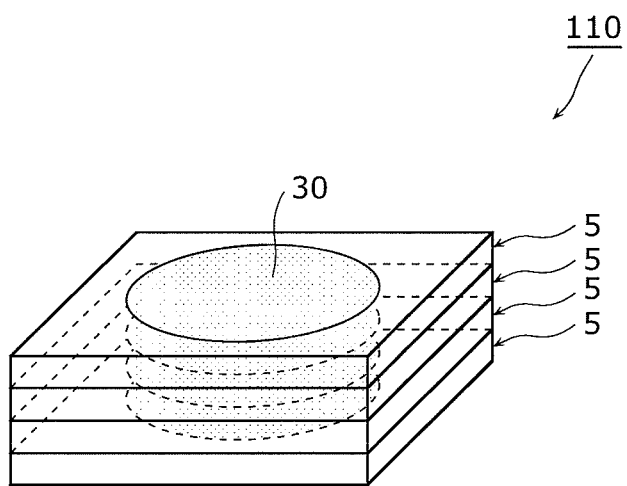
FIG. 14 is an external perspective view of the light-emitting module according to the embodiment 8 of the present invention.

Next, the light-emitting module 110 according to the embodiment 8 shall be described with reference to FIG. 14. FIG. 14 is an external perspective view of the light-emitting module 110 according to the embodiment 8 of the present invention.

As illustrated in FIG. 14, the light-emitting module 110 (LED module) according to the embodiment 8 includes more than one the light-emitting devices 5 according to the embodiment 5 stacked. In the embodiment 8, five light-emitting devices 5 are stacked.

Note that, each of the light-emitting devices 5 may be bonded by an adhesive made of transparent resin, for example. Note that, although the light-emitting devices 5 according to the embodiment 5 are stacked in the embodiment, it is not limited to this example. For example, the light-emitting devices according to the embodiments 2 to 6 or the variations thereof may be stacked. In this case, the same light-emitting devices may be stacked. Alternatively, different light-emitting devices may be stacked.

As described above, according to the light-emitting module 110 of the embodiment 8 of the present invention, the light-emitting devices are stacked. Accordingly, high-output light can be extracted from a small area, and a light-emitting module with omnidirectional light-distribution property can be implemented.

(Embodiment 9)

Figure 15:
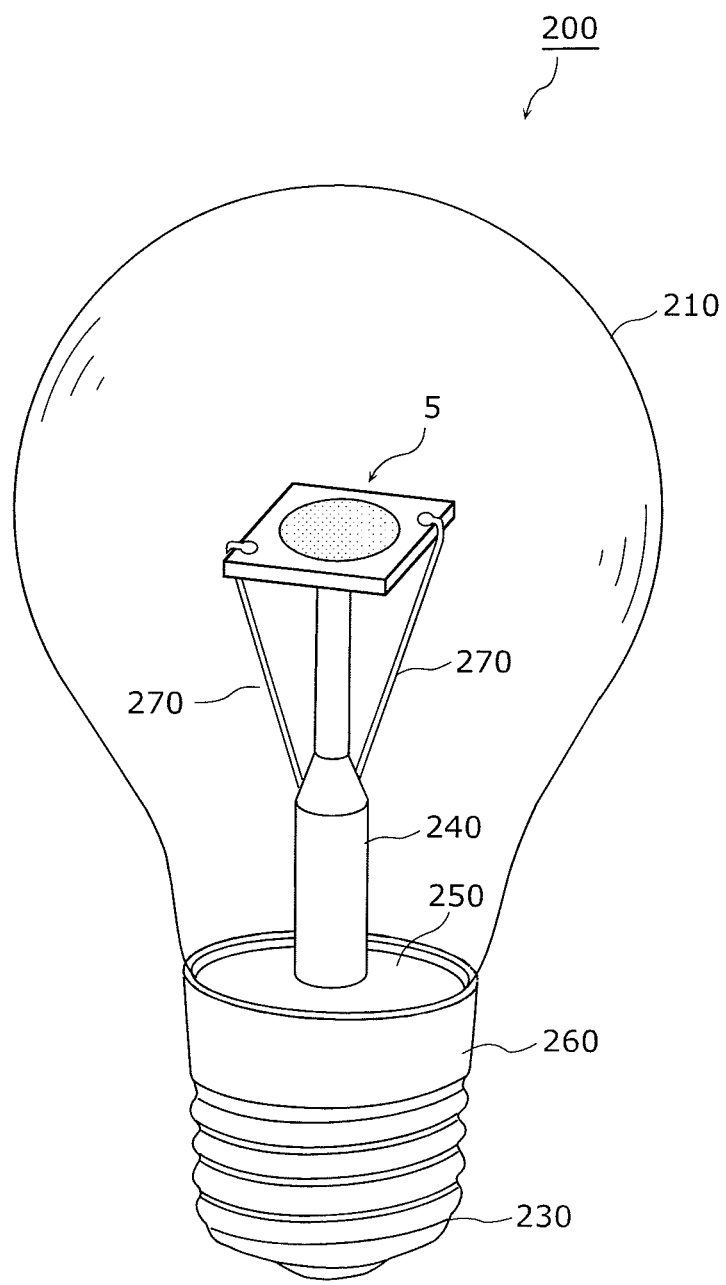
FIG. 15 is an external perspective view of the light bulb shaped lamp according to the embodiment 9 of the present invention.
Figure 16:
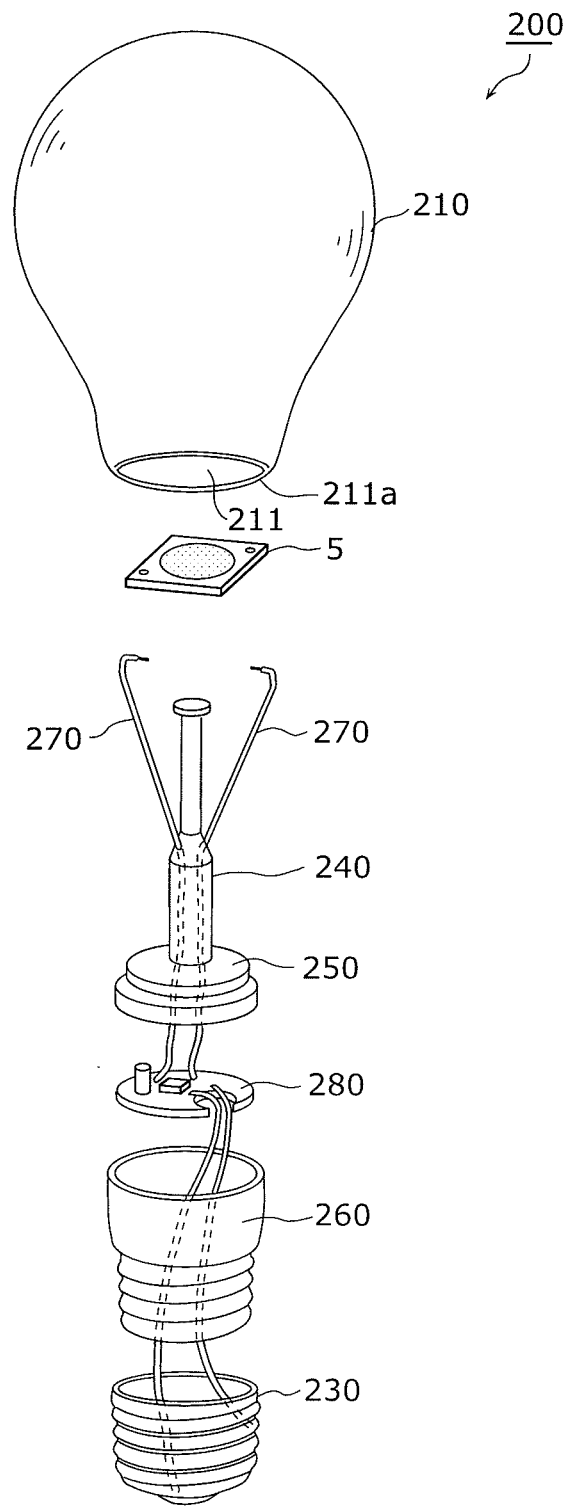
FIG. 16 is an exploded perspective view of the light bulb shaped lamp according to the embodiment 9 of the present invention.
Figure 17:
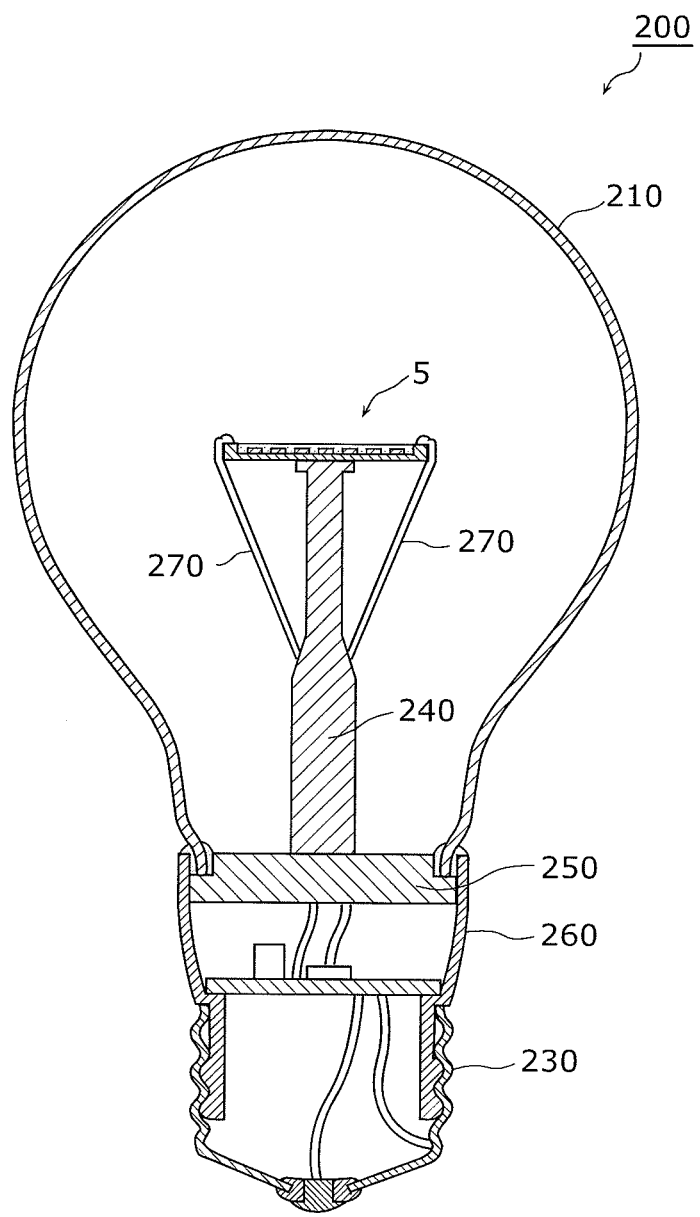
FIG. 17 is a cross-sectional view of the light bulb shaped lamp according to the embodiment 9 of the present invention.

Next, a light bulb shaped lamp 200 according to the embodiment 9 shall be described with reference to FIGS. 15 to 17. FIG. 15 is an external perspective view of the light bulb shaped lamp 200 according to the embodiment 9 of the present invention. FIG. 16 is an exploded perspective view of the light bulb shaped lamp 200 according to the embodiment 9 of the present invention. FIG. 17 is a cross-sectional view of the light bulb shaped lamp 200 according to the embodiment 9 of the present invention.

As illustrated in FIGS. 15 to 17, the light bulb shaped lamp 200 according to the embodiment 9 is a light bulb shaped LED lamp replacing an incandescent light bulb, and includes a translucent globe 210, a light-emitting device 5, a base 230 for receiving power, and a fixing member 240 for fixing the light-emitting device 5. The light bulb shaped lamp 200 according to the embodiment 9 further includes a supporting member 250, a resin case 260, lead wires 270, and a lighting circuit 280. In this embodiment, a case (envelope) of the light bulb shaped lamp 200 is the globe 210, the resin case 260, and the base 230.

The following shall describe components of the light bulb shaped lamp 200 according to the embodiment 9 of the present invention in detail with reference to FIGS. 15 to 17.

First, the globe 210 shall be described. As illustrated in FIGS. 15 to 17, the globe 210 is a hollow component for housing the light-emitting device 5, and is a translucent member transmitting predetermined light from the light-emitting device 5 to outside of the lamp.

In the embodiment 9, the globe 210 is configured of transparent glass (clear glass) made of silica glass. The light-emitting device 5 housed in the globe 210 is visible from outside of the globe 210. As described above, by having the transparent globe 210, it is possible to suppress loss of light from the light-emitting 5 due to the globe 210. Using glass for the globe 210 makes the globe 210 highly resistant to heat. Note that, the globe 210 may not only be made of silica glass, but also made of resin such as acrylic. The globe 210 may not be transparent, and diffusion treatment such as forming a diffusion film on an inner surface of the globe 210 may be performed.

The globe 210 has an opening 211 forming a substantially circular opening plane, and the overall shape of the globe 210 is a protruded sphere elongated from the opening 211. Note that, the shape of the globe 210 is not limited to the shape illustrated in FIG. 15. Type A (JIS C7710) used for the conventional incandescent light bulbs may be used. Alternatively, Type G or Type E may be also used. The globe 210 may be translucent to visible light, and may not necessarily be transparent.

Next, the light-emitting device 5 shall be described. The light-emitting device 5 is a light-emitting module (light-emitting device) which emits predetermined light, and is housed in the globe 210. In the embodiment 9, the light-emitting device 5 according to the embodiment 5 is used.

The light-emitting device 5 is supported and fixed by the fixing member 240. Preferably, the light-emitting portion of the light-emitting device 5 is arranged at the central part of the globe 210 (for example, inside the large-diameter portion in which the inner diameter of the globe 210 is large). With this arrangement, the light bulb shaped lamp 200 can achieve the omnidirectional light distribution property approximated to a common incandescent light bulb using a conventional filament coil when switched on. Note that, the light-emitting device 5 emits light by electric power supplied from the two lead wires 270.

Next, the base 230 shall be described. In the embodiment 9, the base 230 is a receiving part for receiving power for causing the LED in the light-emitting device 5 to emit light, and receives AC voltage from an AC power source (for example a commercial power source of AC 200V) outside of the lamp with two contact points, as illustrated in FIGS. 15 to 17. The power received by the base 230 is input to the power input unit of the lighting circuit 280 through the lead wires.

The base 30 is the type E, for example, and a screw part for screwing in a socket of the lighting apparatus (lighting appliance) is formed on the outer circumferential surface of the base 230, as illustrated in FIG. 17. In addition, on the inner circumferential surface of the base 230, a screw part for screwing in the resin case 260 is formed. Note that, the base 230 is a metal tube with a bottom.

In the embodiment 9, the base 230 is a type E26 base. Accordingly, the light bulb shaped lamp 200 is attached to the socket for the E26 base connected to a commercial AC power source for use. Note that, the base 230 does not have to be a type E26 base, but also a type E17 base or others. The base 230 does not have to be a screw-in base, but may also be a base of different shape, for example, a plug-in base.

Next, the fixing member 240 shall be described. As illustrated in FIGS. 15 to 17, the fixing member 240 is a member extending from the proximity of the opening 211 of the globe 210 toward the inside of the globe 210. The fixing member 240 is rod-shaped, and one end of the fixing member 240 is connected to the light-emitting device 5 and the other end of the fixing member 240 is connected to the supporting member 250.

The fixing component 240 is composed of a material having a higher thermal conductivity than the thermal conductivity of the package of the light-emitting device 5. For example, the fixing member 240 may be composed of a metal or inorganic material such as ceramic, for example. In the embodiment 9, the fixing member 240 is made of aluminium having a thermal conductivity of 237[W/m·K].

As described above, having the thermal conductivity of the fixing member 240 higher than the thermal conductivity of the package of the light-emitting device 5 allows the heat from the light-emitting device 5 to be effectively emitted to the fixing member 240 through the package. With this, the heat from the light-emitting device 5 is dissipated toward the base 230. This suppresses the reduction in the light-emitting efficiency of the LED in the light-emitting device 5 due to increased temperature.

The lower surface of the fixing member 240 on the other end (a side opposite to a side for fixing the light-emitting device 5) abuts the surface of the supporting member 250, and the lower surface of the fixing member 240 and the supporting member 250 are fixed at the abutting part. In the embodiment 9, the fixing member 240 and the supporting member 250 are fixed with a screw screwed in from the back surface of the supporting member 250. Note that, the fixing member 240 and the supporting member 250 are fixed, not only by a screw, but also by bonding using adhesive or others.

Next, the supporting member 250 shall be described. As illustrated in FIGS. 15 and 17, the supporting member 250 is a member connected to the opening end 211a of the opening 211 of the globe 210, and for supporting the fixing member 240. The supporting member 250 is configured to close the opening 211 of the globe 210. In the embodiment 9, the supporting member 250 is fixed, fitting into the resin case 260. Two insertion holes for inserting the lead wires 270 are formed in the supporting member 250.

It is preferable for the supporting member 250 to be composed of a material having higher thermal conductivity than the thermal conductivity of the package of the light-emitting device 5. The supporting member 250 may be formed of metal material or inorganic material such as ceramic. In the embodiment 9, the supporting member 250 is composed of aluminum, the same material as the fixing member 240.

As described above, composing the supporting member 250 with a material with high thermal conductivity allows the heat generated at the light-emitting device 5 conducted to the fixing member 240 by heat conduction to be effectively conducted to the supporting member 250. This suppresses the reduction in the light-emitting efficiency of the LED in the light-emitting device 5 due to increased temperature.

In the embodiment 9, on the upper surface of the supporting member 250 (on the surface toward the globe 210), the fixing member 240 is fixed. The inner surface of the resin case 260 abuts the side surface of the supporting member 250. Note that, the opening end 211a of the opening 211 of the globe 210 abuts the gap on the supporting member 250, and at the gap, the supporting member 250, the resin case 260, and the opening end 211a of the opening 211 of the globe 210 are bonded by an adhesive material.

As described above, the supporting member 250 is connected to the globe 210. Thus, the heat from the light-emitting device 5 conducted to the supporting member 250 is heat-conducted to the globe 210 configuring the envelope, and is dissipated to air from the outer surface of the globe 210. In addition, the supporting member 250 is connected to the resin case 260, and thus the heat from the light-emitting device 5 conducted to the supporting member 250 is heat-conducted to the resin case 260, and is dissipated to air from the outer surface of the resin case 260 configuring the envelope as well.

Next, the resin case 260 shall be described. As illustrated in FIGS. 15 to 17, the resin case 260 is an insulating case for insulating the fixing member 240 and the base 230 and for housing the lighting circuit 280. The resin case 260 is composed of a cylindrical upper first case part and a cylindrical lower second case part.

The first case part has an inner surface contacting the supporting member 250. The outer surface of the first case part is exposed to outside. Thus, the heat conducted to the resin case 260 is mostly dissipated from the first case part. The second case part has an outer circumferential surface contacting the inner circumferential surface of the base 230. In the embodiment 9, a screw part for screwing into the base 230 is formed on the outer circumferential surface of the second case part, and the second case part contacts the base 230 through the screw part. Accordingly, the heat conducted to the resin case 260 is conducted to the base 230 through the second case part, and is dissipated from the outer surface of the base 230 as well.

Next, the lead wires 270 shall be described. As illustrated in FIGS. 15 to 17, the two lead wires 270 are wires for supplying power for causing the light-emitting device 5 to emit light to the light-emitting device 5. The surfaces of the lead wires are coated with insulating resin film.

The lead wires 270 are inserted through the supporting member 250. The ends on the one side of the lead wires 270 are connected to the light-emitting device 5, and the ends on the other side of the lead wires 270 are electrically connected to the power output unit of the lighting circuit 280.

Next, the lighting circuit 280 shall be described. As illustrated in FIGS. 15 and 17, the lighting circuit 280 is a circuit for lighting the LED in the light-emitting device 5, and is housed in the resin case 260. The lighting circuit 280 includes a plurality of circuit elements and a circuit board for mounting the circuit elements.

In the embodiment 9, the lighting circuit 280 converts the AC power received from the base 230 into DC power, and supplies the DC power to the LED through the lead wires 270. The lighting circuit 280 may be composed of a diode bridge for full wave rectification, a capacitor for smoothing, and a resistor for adjusting current, for example.

Note that, it is not necessary for the light bulb shaped lamp 200 to incorporate the lighting circuit 280. For example, the light bulb shaped lamp 200 may not include the lighting circuit 280 when the DC power is directly supplied from the lighting apparatus or cells. In addition, the lighting circuit 280 is not limited to a smoothing circuit. A light-adjusting circuit, a voltage booster circuit, and others may be appropriately selected and combined.

According to the light bulb shaped lamp 200 according to the embodiment 9 of the present invention, since the light-emitting device 5 is configured to emit light omnidirectionally, the light-distribution property identical to the conventional incandescent light bulb can be achieved.

Note that, in the embodiment 9, the light-emitting device 5 according to the embodiment 5 is used as the light-emitting device 5 (light-emitting module). However, a light-emitting device according to the other embodiments or a light-emitting module composed of the light-emitting devices according to the other embodiments may also be used.

(Embodiment 10)

Figure 18:
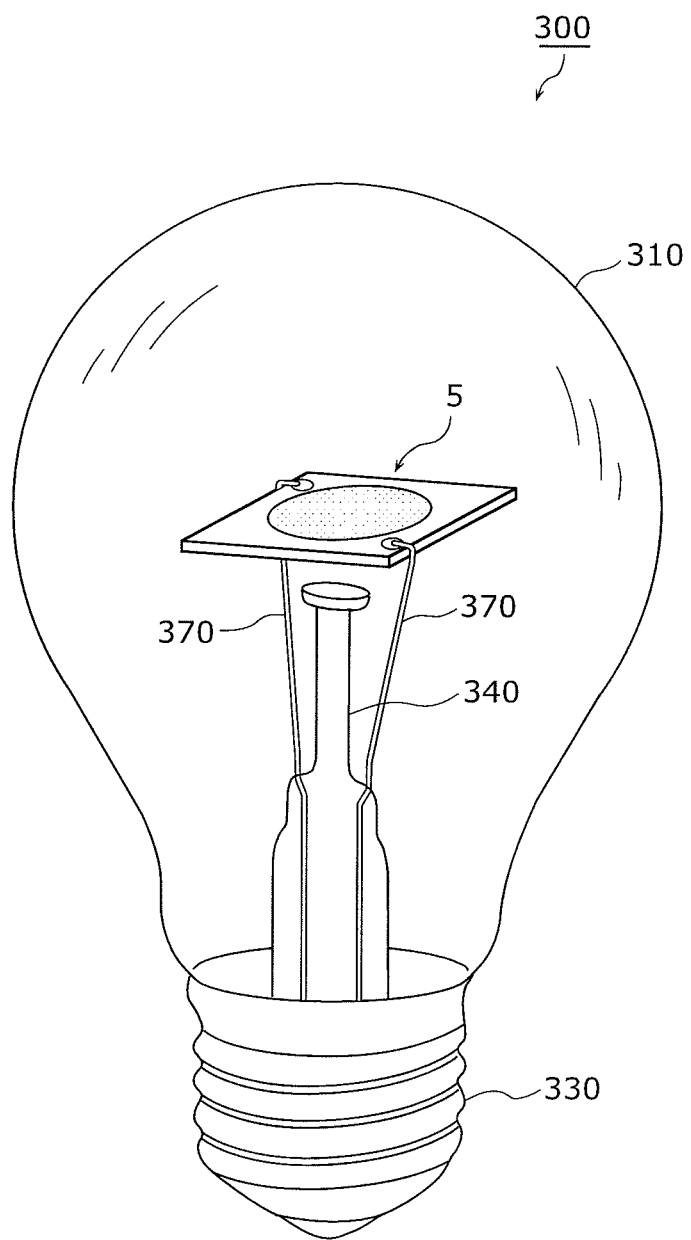
FIG. 18 is an external perspective view of the light bulb shaped lamp according to the embodiment 10 of the present invention.

Next, a light bulb shaped lamp 300 according to the embodiment 10 of the present invention shall be described with reference to FIG. 18. FIG. 18 is an external perspective view of the light bulb shaped lamp 300 according to the embodiment 10 of the present invention.

As illustrated in FIG. 18, the light bulb shaped lamp 300 according to the embodiment 10 of the present invention is a light bulb shaped LED lamp replacing an incandescent electric bulb in the same manner as the light bulb shaped lamp 200 according to the embodiment 9, and includes a light-emitting device 5, a translucent globe 310 for housing the light-emitting device 5, and a base 330 attached to the globe 310. In addition, the light bulb shaped lamp 300 includes a stem 340, two lead wires 370, and a lighting circuit 180 (not illustrated). Note that, the description for the globe 310, the base 330, and the lighting circuit shall be omitted since these components are identical to the globe 210 according to the globe 210 in the embodiment 9. Furthermore, the light-emitting device 5 according to the embodiment 5 is used as the light-emitting device 5, in the same manner as the embodiment 9.

In the embodiment 10, the stem 340 is provided extending from the opening of the globe 310 toward the inside of the globe 310. The stem 340 according to the embodiment 10 is a stem made of glass used for a common incandescent light bulb, and extending toward the inside of the globe 310.

The end portion of the stem 340 on the base side is formed in a flared shape coinciding with the shape of the opening of the globe 310. The end portion of the stem 340 formed in the flared shape is joined with the opening of the globe 310 so as to close the opening of the globe 310. In addition, parts of two lead wires 370 are partially sealed in the stem 120. Accordingly, it is possible to supply power to the light-emitting device 5 in the globe 310 from outside of the globe 310 while keeping the globe 310 airtight. Accordingly, the light bulb shaped lamp 300 according to the embodiment 10 can prevent water or water vapor from entering the globe 310 for a long period of time, and it is possible to suppress the degradation of the light-emitting device 5 due to moisture.

The stem 340 is made of soft glass transparent to visible light. With this, the light bulb shaped lamp 300 can suppress the loss of light generated at the light-emitting device 5, by the stem 340. In addition, the light bulb shaped lamp 300 can prevent the shadow formed by the stem 340.

Note that, the stem 340 does not necessarily close the opening at the globe 310, and may be attached to a part of the opening.

In the embodiment 10, the two lead wires 370 are electric wires for supplying power to cause the light-emitting device 5 to emit light. The lead wires 370 are also supporting members supporting the light-emitting device 5, and suspend the light-emitting device 5 at a constant position in the globe 310. Each of the lead wires 170 is a composite wire including an internal lead wire, a Dumet wire (copper-clad nickel steel wire) and an external lead wire 173 joined in order, and has strength sufficient to hold the light-emitting device 5.

As described above, according to the light bulb shaped lamp 300 according to the embodiment 10 of the present invention, since the light-emitting device 5 is configured to emit light omnidirectionally, the light-distribution property identical to the conventional incandescent light bulb can be achieved.

Note that, in the embodiment 10, the light-emitting device 5 according to the embodiment 5 is used as the light-emitting device 5 (light-emitting module). However, a light-emitting device according to the other embodiments or a light-emitting module composed of the light-emitting devices according to the other embodiments may also be used.

(Variations)

As described above, the light-emitting device, the light-emitting module, and the lamp according to the present invention have been described based on the embodiments and the variations thereof. However, the present invention is not limited to the embodiments and the variations.

Figure 19:
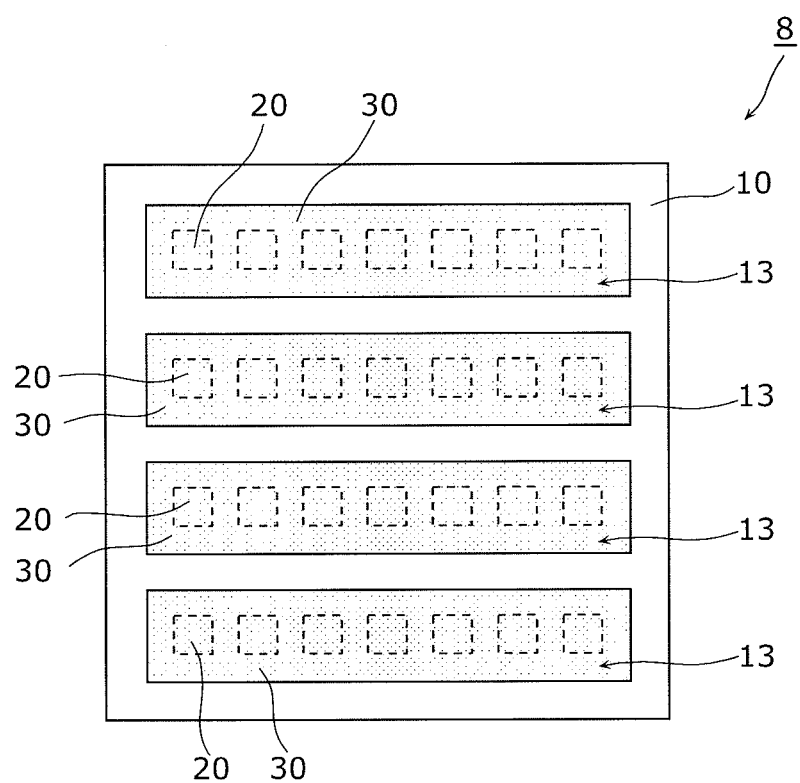
FIG. 19 is a plan view of the light-emitting device according to the variation of the present invention.

For example, one recess is formed in the package 10 in the embodiments; it is not limited to this example. As in the light-emitting device 8 according to the variation illustrated in FIG. 19, multiple recesses may be formed in the package 10, multiple LEDs 20 are provided in the recesses, and the sealing member 30 may be sealed. In this case, although multiple LEDs 20 are provided in each recess in FIG. 10, one LED 20 may also be provided for each recess.

In the embodiments, a blue LED chip is used as the LED 20 and yellow phosphor particles are used as the phosphor particles. However, the combination of the LED 20 and the phosphor particles are not limited to this example.

For example, the white light may be emitted using a combination of the blue LED chip which emits blue light, green phosphor particles which are excited by the blue light and emit green light, and the red phosphor particles which are excited by the blue light and emit red light. Alternatively, the white light may be emitted using a combination of an ultraviolet LED chip which emits ultraviolet light having a wavelength shorter than the wavelength of the light from the blue LED chip, blue phosphor particles, green phosphor particles, and red phosphor particles which are excited mainly by the ultraviolet light and emit blue light, red light, and green light, respectively.

Furthermore, although the embodiments illustrate examples in which the light-emitting devices and the light-emitting modules are applied to the light bulb shaped lamp, it is not limited to this example. For example, the light-emitting device and the light-emitting module according to the embodiments may be applied to a straight-tube lamp or a circular-tube lamp composed of a circular tube. The light-emitting device or the light-emitting module may also be applied to an apparatus other than a lamp, having the light-emitting device as the light source.

In the embodiments, YAG-series yellow phosphor particles are used as the wavelength conversion material included in the sealing member 30, the sintered material film 40 and the phosphor containing resin 31. However, it is not limited to this example. For example, other yellow phosphor particles may be used, or green phosphor particles and the red phosphor particles may also be used instead of the yellow phosphor particles.

The main component of the sealing member 30 and the phosphor containing resin 31 does not have to be a silicone resin, and an organic material such as a fluorine series resin may be used.

Alternatively, in the sealing member 30 and the phosphor containing resin, light diffusion material may be included as necessary. Particles such as silica are used as the light diffusion material.

Furthermore, in the embodiments described above, the LED is used as an example of the semiconductor light-emitting element. However, the semiconductor light-emitting device may be a semiconductor laser and an organic electro luminescent (EL) light-emitting element.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

[Industrial Applicability]

The present invention is widely applicable to light source of the devices such as LED lamp replacing fluorescent lamp and others.

[Reference Signs List]

1, 1A, 2, 2A, 3, 3A, 4, 4A, 5, 5A, 6, 8 Light-emitting device
10 Package
11, 11A, 13 Recess
11a, 13a Bottom surface
11b, 13a Side surface
12, 12A Groove
20 LED
30 Sealing member
31 Phosphor containing resin
40, 40A Sintered material film
50 Wire
60, 103 Electrode terminal
100, 110 Light-emitting module
101 Board
102 Line
200, 300 Light bulb shaped lamp
210, 310 Globe
211, 311 Opening
211a Opening end
230, 330 Base
240 Fixing member
250 Supporting member
260 Resin case
270, 270 Lead wire
280 Lighting circuit
340 Stem

The invention claimed is:

1. A light-emitting device comprising:
a package which is translucent;
a semiconductor light-emitting element provided in a recess in the package;
a sealing member for sealing said semiconductor light-emitting element and filling the recess; and
a sintered material film provided on a back surface of said package, for converting a wavelength of light emitted by said semiconductor light-emitting element to a predetermined wavelength,
wherein the recess includes a bottom surface on which said semiconductor light-emitting element is mounted and a side surface surrounding the bottom surface,
said sealing member includes a first wavelength conversion material for converting the wavelength of the light emitted by said semiconductor light-emitting element to a predetermined wavelength, and
said sintered material film is composed of a second wavelength conversion material for converting, to the predetermined wavelength, the wavelength of the light emitted by said semiconductor light-emitting element and transmitted through said package, and a binder for sintering, the binder comprising an inorganic material,
the light-emitting device further comprising a groove provided in the back surface of the package, for holding a third wavelength conversion material for converting the wavelength of the light emitted by said semiconductor light-emitting element to the predetermined wavelength.

2. The light-emitting device according to claim 1, wherein the side surface is substantially perpendicular to the bottom surface.

3. The light-emitting device according to claim 1, wherein said groove surrounds said sintered material film.

4. The light-emitting device according to claim 1, wherein a total transmittance of said package is equal to or higher than 50%.

5. The light-emitting device according to claim 1, wherein said package comprises ceramic.

6. The light-emitting device according to claim 1, wherein said package comprises resin.

7. The light-emitting device according to claim 1, wherein a plurality of semiconductor light-emitting elements are provided in the recess.

8. A light-emitting module comprising:
a plurality of the light-emitting devices according to claim 1 stacked.

9. A light-emitting module comprising:
the light-emitting device according to claim 1, and
a translucent board on which the light-emitting device is mounted.

10. A lamp comprising:
the light-emitting module according to claim 8.

11. A lamp comprising the light-emitting module according to claim 9.

* * * * *